United States Patent [19]

Tomisawa

[11] Patent Number: 5,012,141
[45] Date of Patent: Apr. 30, 1991

[54] SIGNAL DELAY DEVICE USING CMOS SUPPLY VOLTAGE CONTROL

[75] Inventor: Norio Tomisawa, Hamamatsu, Japan

[73] Assignee: Yamaha Corporation, Hamamatsu, Japan

[21] Appl. No.: 289,479

[22] Filed: Dec. 21, 1988

Related U.S. Application Data

[63] Continuation of Ser. No. 760,332, Jul. 29, 1985, abandoned.

[30] Foreign Application Priority Data

| Jul. 31, 1984 | [JP] | Japan | 59-160784 |
| Jul. 31, 1984 | [JP] | Japan | 59-160785 |
| Jul. 31, 1984 | [JP] | Japan | 59-160786 |
| Nov. 26, 1984 | [JP] | Japan | 59-179551[U] |
| Dec. 18, 1984 | [JP] | Japan | 59-267050 |
| Dec. 21, 1984 | [JP] | Japan | 59-270431 |

[51] Int. Cl.[5] ............................................. H03R 5/12
[52] U.S. Cl. ........................... 307/594; 307/451; 307/585; 307/592
[58] Field of Search ................... 307/451–452, 307/469, 481, 573, 575, 579, 585, 269, 591, 592, 594, 597, 601, 602, 603, 605, 296 R, 297, 263

[56] References Cited

U.S. PATENT DOCUMENTS

| 3,914,702 | 10/1975 | Gehweiler | 330/264 |
| 3,996,481 | 12/1976 | Chu et al. | 307/481 X |
| 4,473,762 | 9/1984 | Iwahashi et al. | 307/591 X |
| 4,482,826 | 11/1984 | Ems et al. | 307/602 |
| 4,514,647 | 4/1985 | Shoji | 307/605 X |
| 4,585,955 | 4/1986 | Uchida | 307/297 |
| 4,638,184 | 1/1987 | Kimura | 307/296 R X |

FOREIGN PATENT DOCUMENTS

| 0103371 | 9/1978 | Japan | 307/451 |
| 0099035 | 6/1983 | Japan | 307/451 |
| 57176180 | 4/1984 | Japan . |
| WO84/02621 | 7/1984 | PCT Int'l Appl. . |
| 2086681 | 5/1982 | United Kingdom . |

Primary Examiner—David Hudspeth
Attorney, Agent, or Firm—Spensley Horn Jubas & Lubitz

[57] ABSTRACT

A signal delay device comprises a CMOS gate circuit having an input terminal to which a binary input signal to be delayed is applied, an output terminal from which a delayed signal is derived and power voltage supply terminals to which operation power voltages are applied. The delay time of the CMOS gate circuit depends upon voltage applied to it and, utilizing this phenomenon, voltage control means is provided in a power supplying path for the CMOS gate circuit for controlling voltage applied to the CMOS gate circuit, The signal delay device using the CMOS gate circuit is applied to various circuits including an analog signal delay circuit, a jitter absorption circuit and a fixed head type magnetic tape reproducing device.

9 Claims, 32 Drawing Sheets

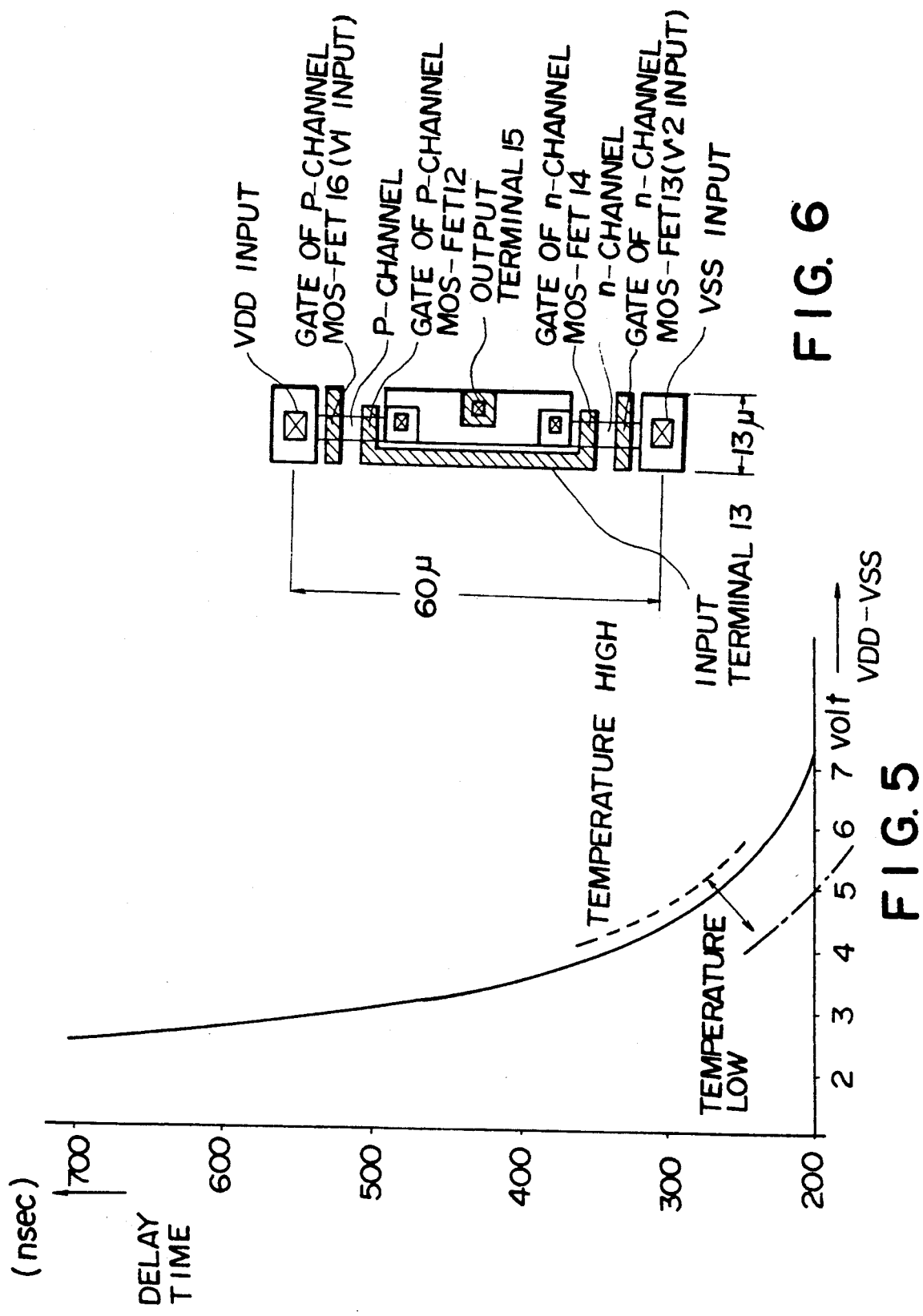

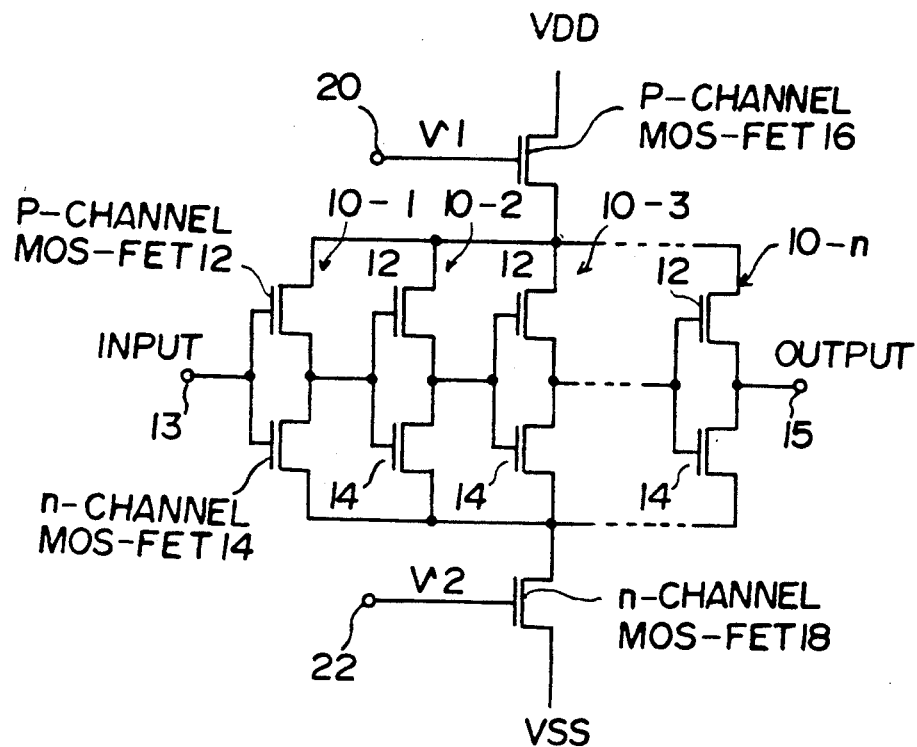
F I G. 9
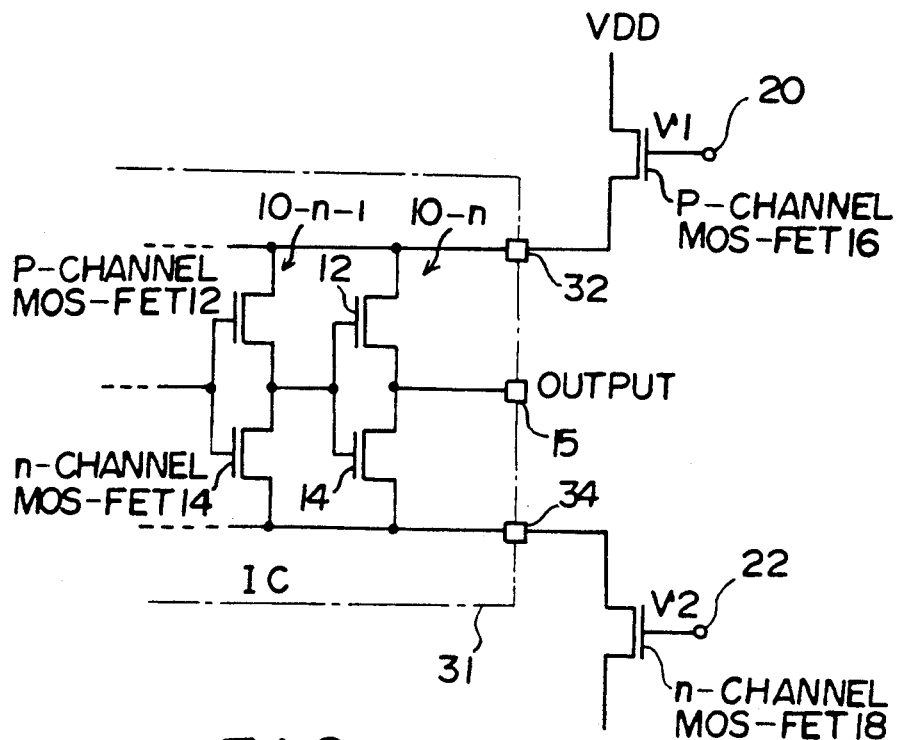
F I G. 10

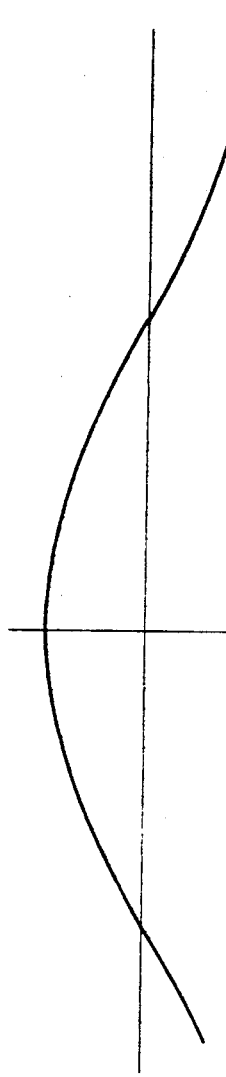
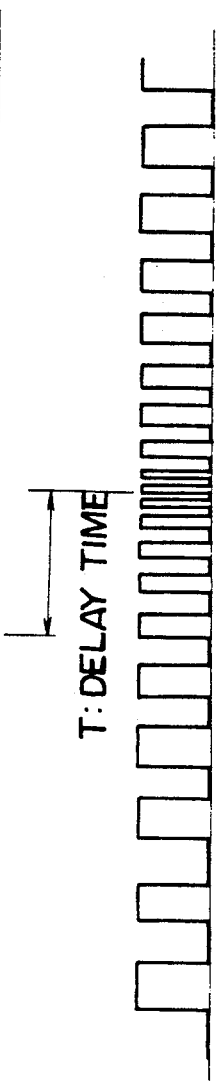
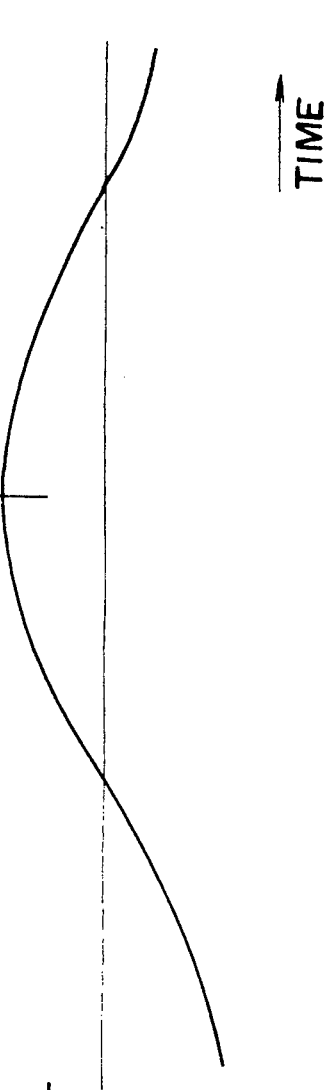
FIG. 23a  ANALOG INPUT TO INPUT TERMINAL 119
FIG. 23b  OUTPUT OF FM CKT. 120
FIG. 23c  OUTPUT OF DELAY CKT. 138
FIG. 23d  ANALOG OUTPUT FROM OUTPUT TERMINAL 168
T: DELAY TIME
TIME

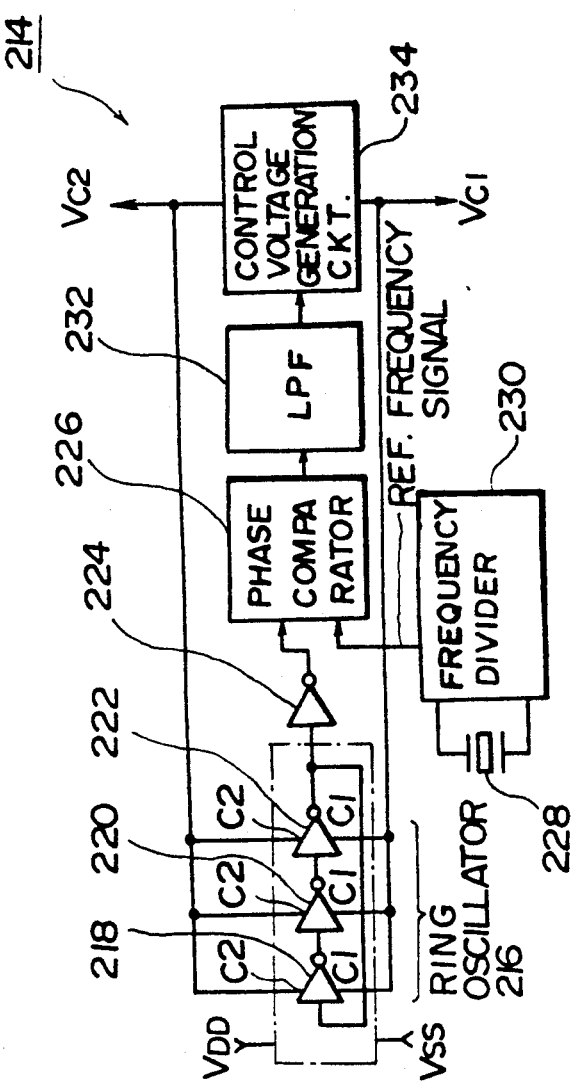
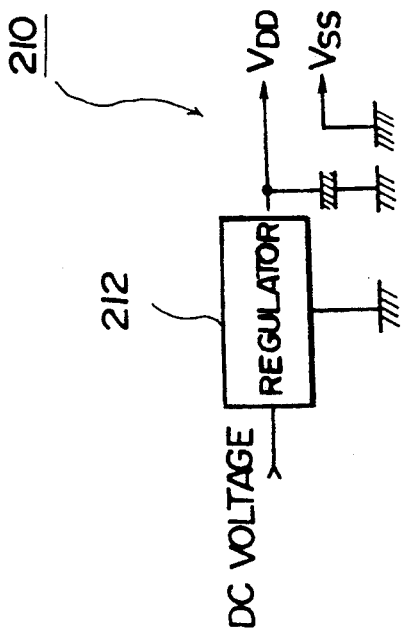
FIG. 26b

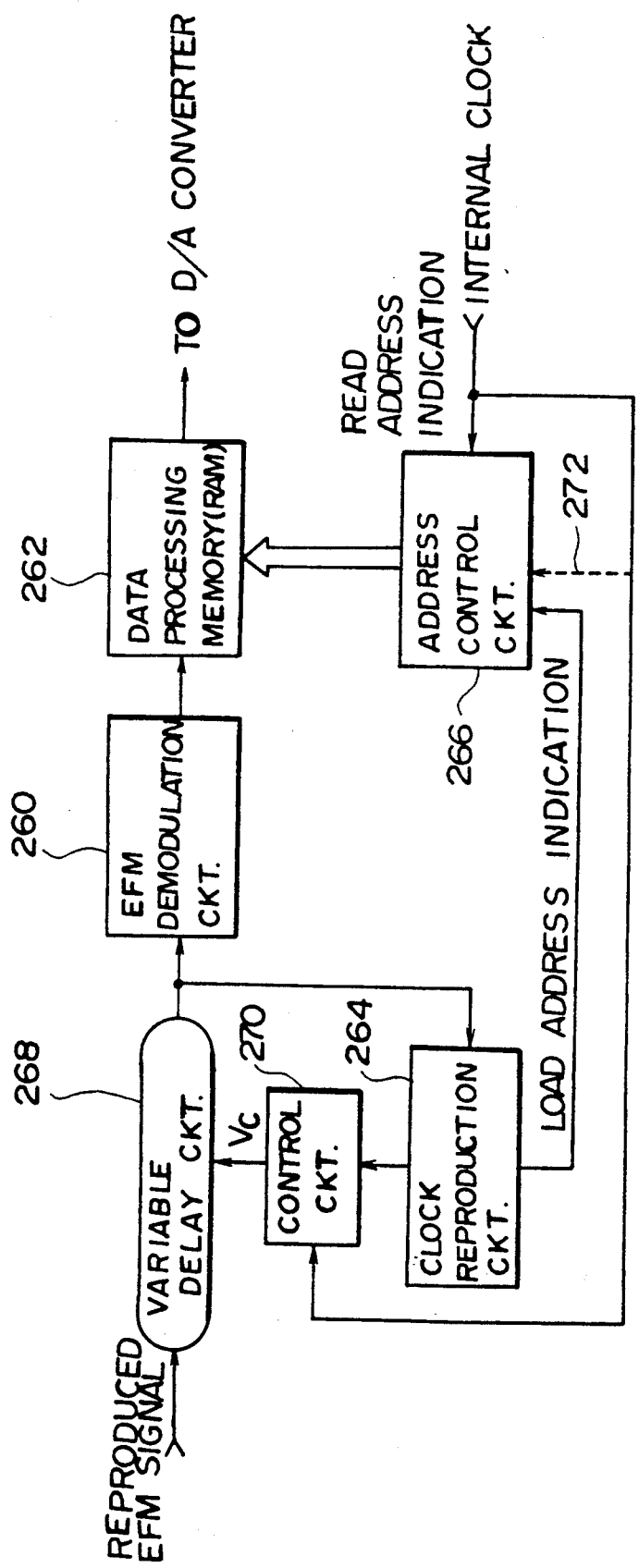
F I G. 31

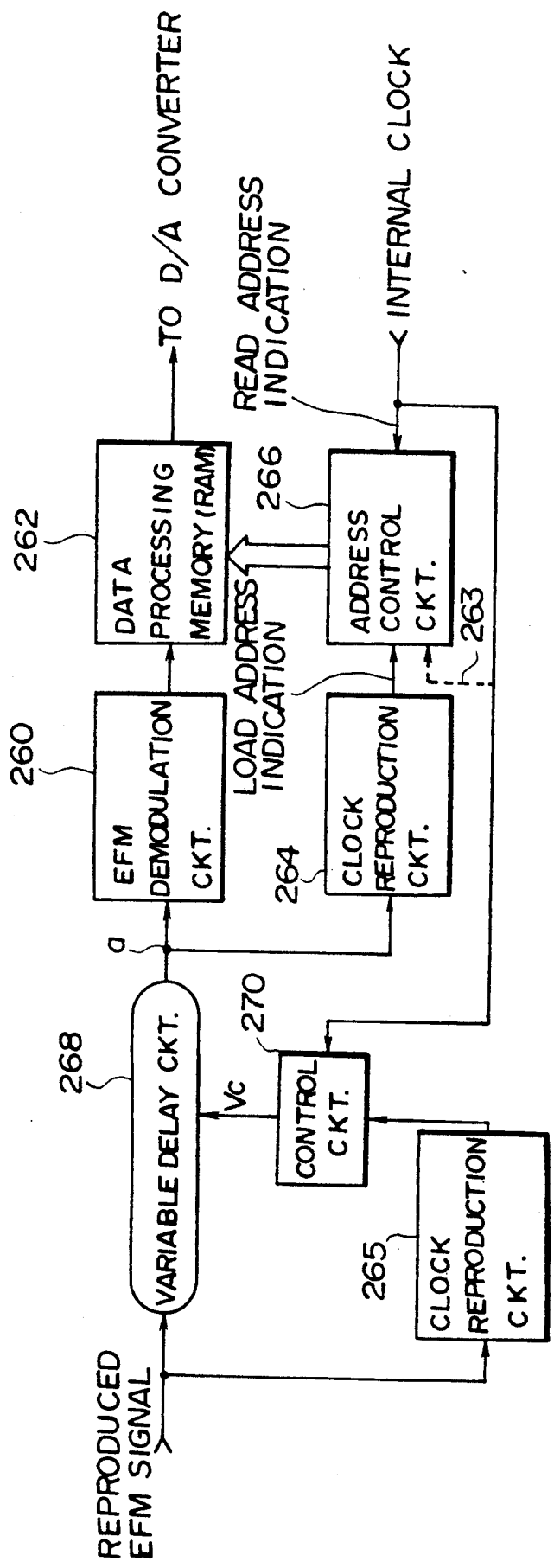
F I G. 33

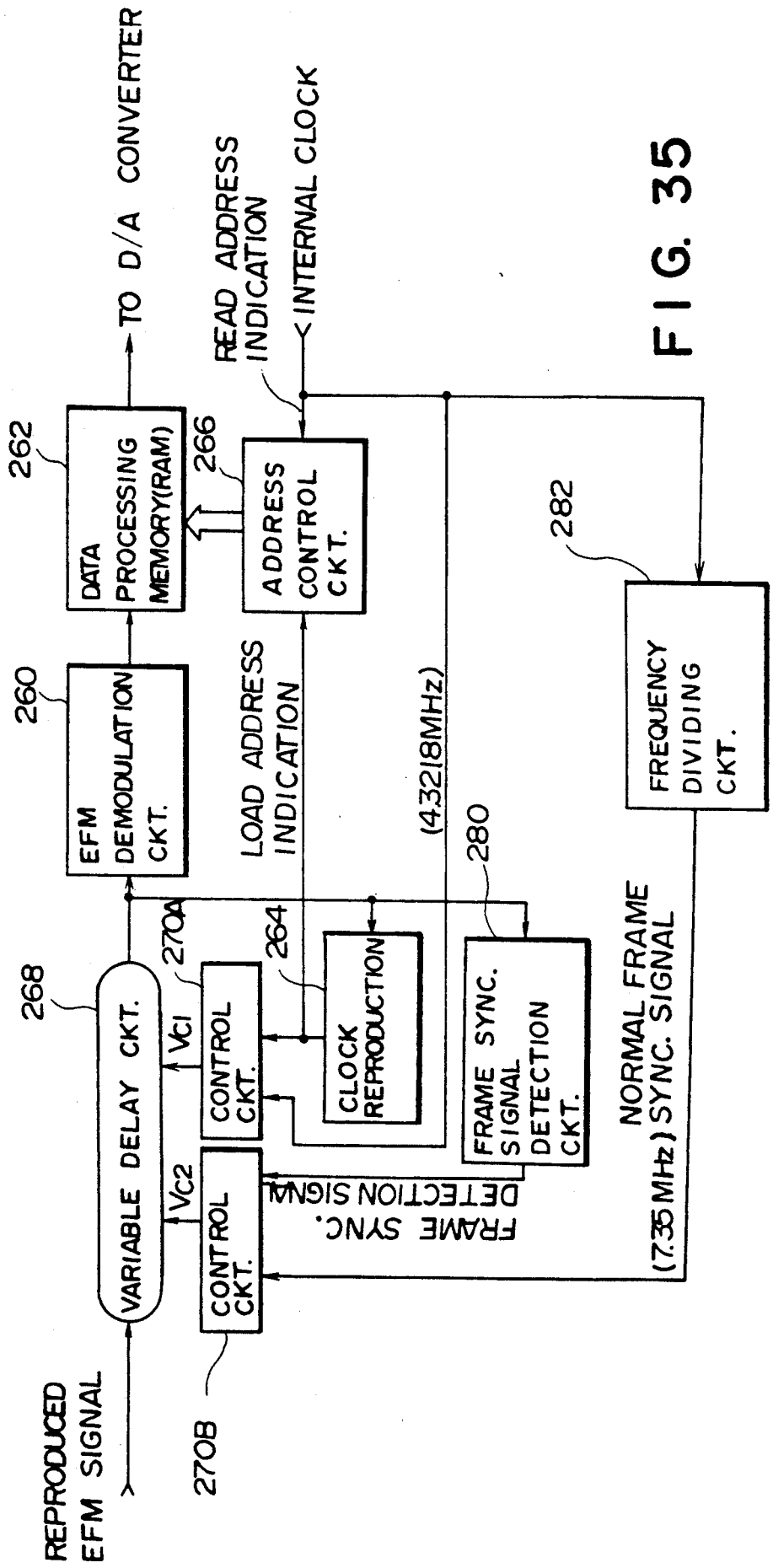
F I G. 35

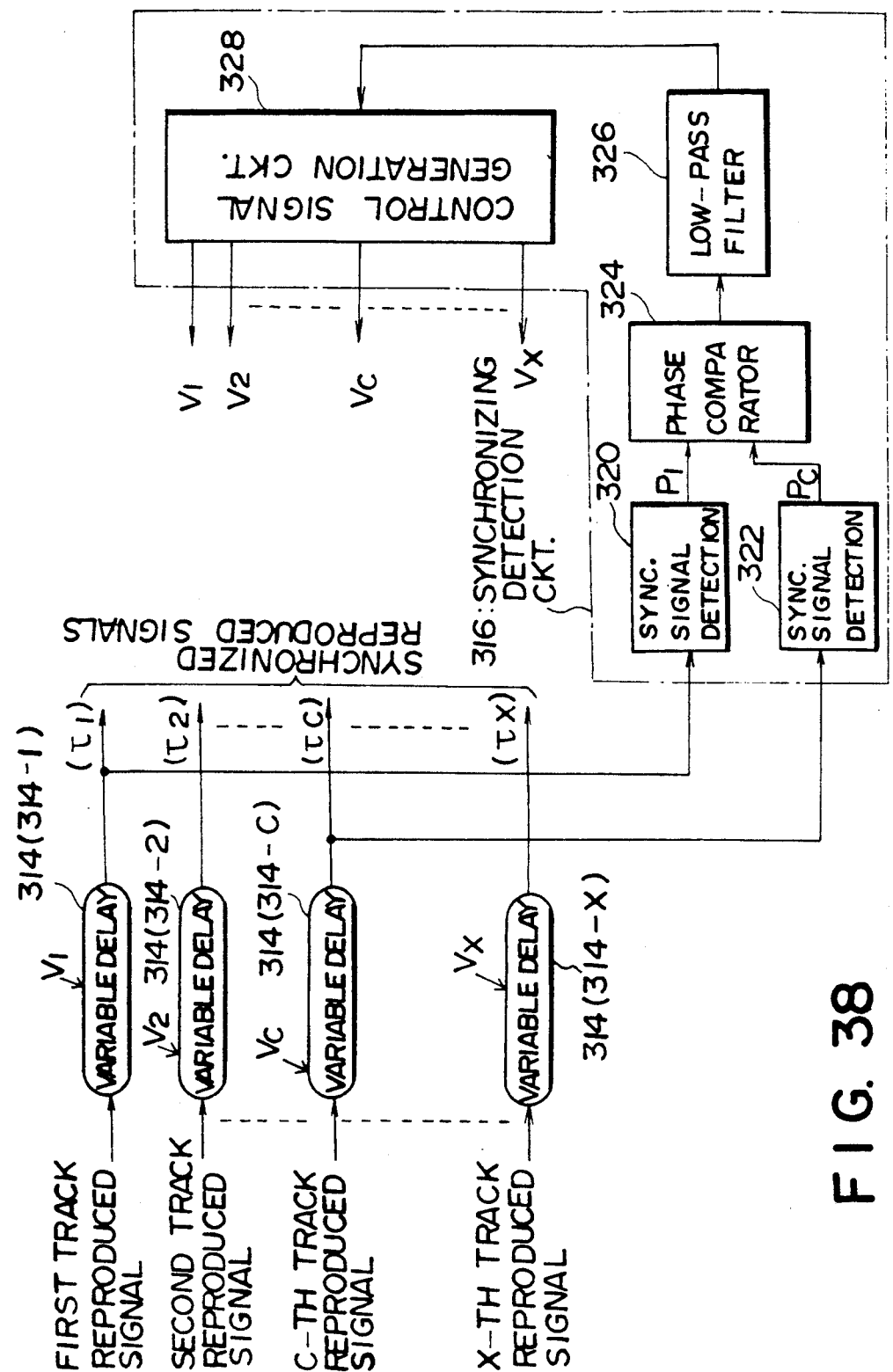
F I G. 38

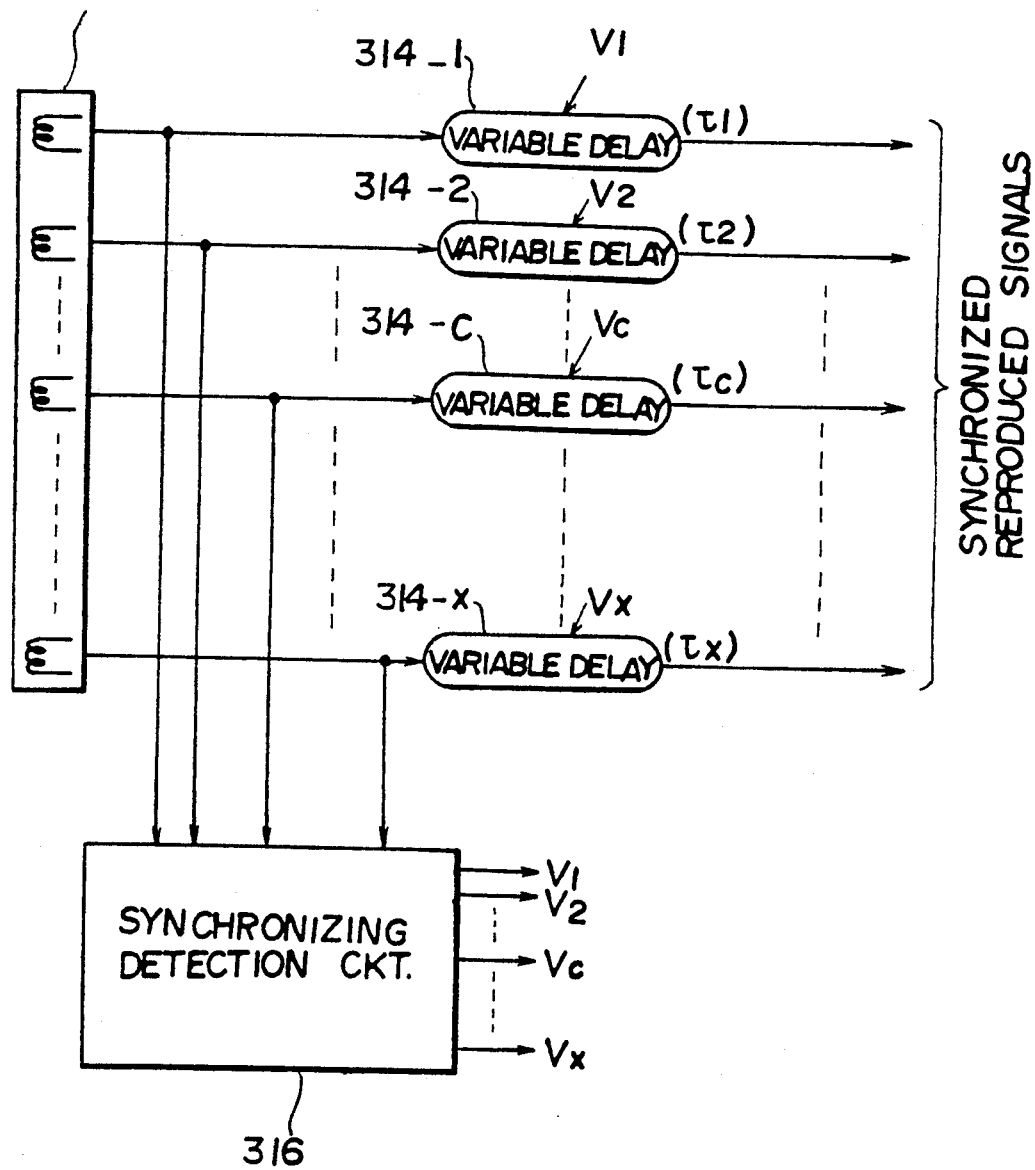
F I G. 42

SIGNAL DELAY DEVICE USING CMOS SUPPLY VOLTAGE CONTROL

This is a continuation of copending application Ser. No. 06/760,332 filed on July 29, 1985 now abandoned.

BACKGROUND OF THE INVENTION

This invention relates to a signal delay device a delay time of which can be controlled easily.

Known in the art of a signal delay circuit are various circuits such, for example, as a physical delay line, a distributed constant circuit, a bucket-brigade device (BBD), a charge-coupled device (CCD), and a shift register and a program control utilizing a random-access memory (RAM) in a digital system.

In various circuits to which a signal delay circuit is applied, there is a technical demand for arbitrarily varying a delay time of the delay circuit. Such arbitrary variation of the delay time can hardly be achieved by a delay line or a distributed constant circuit and, for this purpose, a bucket-brigade device, a charge-coupled device, a shift register or like device which uses a clock pulse for transmission of a signal is generally employed to control the frequency of the clock pulse.

In such delay system utilizing a clock pulse for transmission of a signal, a signal is sampled by a clock pulse and, accordingly, resolution of the system along the time axis is determined by the clock period. As a result, in a case where, for example, a pulse frequency modulation signal containing analog data along the time axis is to be delayed, a phase error tends to occur in the delay output. This defect can theoretically be eliminated by employing a very fast clock and thereby improving the resolution. This requires, however, increase in the number of stages of a delay element such as a bucket-brigade device, a charge-coupled device or a shift register with resulting difficulties in the circuit design and increase in the manufacturing costs.

It is, therefore, a first object of the invention to provide a signal delay device a delay time of which can be readily controlled without causing a phase error.

For achieving this object, the invention utilizes the phenomena that a CMOS gate has a delay time between its input and output terminals and this delay time changes depending upon voltage applied thereto.

The delay time of the CMOS gate depends upon power voltage and temperature. The smaller the power voltage, the longer the delay time and the larger the rate of change. As to the temperature, the higher the temperature, the longer the delay time. This is because conductance of the element of the CMOS gate changes due to the power voltage and temperature. Since dependency of the delay time upon the power voltage and temperature is too large to be ignored and influences of these factors are observed as instability in the oscillation period in an oscillation circuit and increase in distortion in the transmission system, it has been difficult to use the CMOS gate as a delay circuit in a circuit which requires a precision control. For overcoming such difficulty, it is conceivable to use a strictly stabilized power source and provide the CMOS gate in a thermostatic oven. This will however require a bulky and costly circuitry.

It is, therefore, a second object of the invention to provide a delay time stabilizing circuit capable of accurately stabilizing the delay time of the delay circuit utilizing the CMOS gate with a simple construction.

The above described delay circuit utilizing the CMOS gate is applicable to various circuits and devices. One of them is an analog delay circuit.

As described above, the prior art analog delay circuit using a bucket-brigade device, a charge-coupled device, a shift register or the like device uses a clock pulse for transmitting a signal. Since a signal is sampled by a clock pulse in this type of delay circuit, resolution in the time axis is determined by the clock period with a result that the distortion factor increases. Further, although the delay time can be changed by changing the clock period in this type of delay circuit, resolution also is caused to change with the change of the clock period.

It is, therefore, a third object of the invention to provide an analog delay circuit capable of delaying an analog signal with a high resolution and a low distortion factor and also capable of changing the delay time continuously without changing the resolution by employing the delay circuit using the CMOS gate.

The delay circuit utilizing the CMOS gate finds application also in a circuit for absorbing a jitter (i.e., sway along the time axis) which occurs in reproducing a signal recorded on a recording medium such as a disc or a tape.

In a case where a recorded signal is a pulse frequency modulation signal such as an FM signal of a video disc which takes a continuous value along the time axis, a jitter occurring in a reproduction mode due to instability of a drive system for the recording medium causes distortion or noise in demodulation. For preventing occurrence of such jitter, it is conventional to apply a servo control generally called a tangential control according to which the drive system or a pickup head itself is included in the servo loop. This system, however, requires a movable portion provided in the pickup head for performing the tangential control with a result that the construction of the pickup head becomes complicated. Besides, the tangential control requires a high speed response and therefore requires a construction of a small inertia. It is however difficult to realize a construction of a small inertia with such a complicated construction. The same is the case with a device using a tape as the recording medium such as a tape deck and a magnetic tape memory.

It is, therefore, a fourth object of the invention to provide a jitter absorption circuit employing the delay circuit utilizing the CMOS gate in a device for reproducing a recorded signal, the jitter absorption circuit being capable of absorbing a jitter without providing a device for absorbing jitter in the pickup head.

The delay circuit utilizing the CMOS gate is applicable also to a circuit for absorbing a jitter from a reproduced signal on a Compact Disc in the Compact Disc Digital Audio System.

In a Compact Disc, a jitter occurs during reproduction due to instability of the drive system and this causes wow and flutter. For preventing occurrence of jitter, a jitter absorption circuit is employed to effect correction along the time axis. This jitter absorption circuit includes a data processing memory which comprises an error correction region and a jitter absorption region. This jitter absorption region requires a large capacity so that it will be able to cope with a jitter of a large magnitude.

It is, therefore, a fifth object of the invention to provide a jitter absorption circuit which can obviate the jitter absorption memory or reduce the size thereof by employing the delay circuit utilizing the CMOS gate.

Still another application of the delay circuit utilizing the CMOS gate is a circuit for correcting a synchronizing error between signals reproduced from respective tracks due to azimuth deviation of a magnetic head in a fixed head type magnetic tape reproducing device such as a multiple track PCM tape recorder.

Azimuth deviation of a magnetic head in a magnetic tape reproducing device is difference between the angle of inclination of a recording head to the magnetic tape and the angle of inclination of a reproducing head to the magnetic tape. Gaps of the recording and reproducing heads are both designed to become normal to the running direction of the magnetic tape so that there will be no azimuth deviation. In actuality, however, azimuth deviation does occur, for in most cases the recording head is constructed separately from the reproducing head.

For correcting such azimuth deviation, a conventional method is to adjust the inclination of the magnetic heads strictly. This method necessitates individual adjustment for each device. Besides, this method cannot cope with irregularity in the recording heads. Another prior art method is to adjust azimuth automatically by slightly moving the magnetic heads. This method requires a very complicated movable mechanism in the magnetic heads.

It is, therefore, a sixth object of the invention to provide, by employing the delay circuit utilizing the CMOS gate, a fixed head type magnetic tape reproducing device capable of correcting a synchronizing error between signals reproduced from the respective tracks without performing adjustment of azimuth of the magnetic heads.

SUMMARY OF THE INVENTION

The first object of the invention is achieved by providing a voltage control means for controlling voltage applied to a CMOS gate circuit between the gate circuit and its power sources so that the signal delay time between an input terminal and an output terminal of the gate circuit can be controlled by this voltage control means.

According to the invention, by utilizing the phenomena that the CMOS gate has a delay time between its input and output terminals and that the delay time changes depending upon applied voltage, the delay time can be readily controlled by changing applied voltage. Besides, since an original signal is not transmitted through sampling by a clock pulse as in the prior art delay circuits using the bucket-brigade device, charge-coupled device, shift register and the like but is continuously delayed in its original form, any signal including one having analog data along the time axis such as a pulse frequency modulation signal can be delayed without causing a phase error.

The second object of the invention is achieved by providing means for producing an analog voltage corresponding to the delay time of the CMOS gate circuit and means for supplying this voltage as operation voltage for the CMOS gate circuit thereby to stabilize the delay time of the CMOS gate circuit.

According to this delay time stabilizing circuit, the delay time can be stabilized readily and accurately without using a strictly stabilized power source and a thermostatic oven.

The third object of the invention is achieved by providing an analog delay circuit which comprises a frequency modulation circuit for pulse frequency-modulating an input analog signal, a delay circuit using a CMOS gate for delaying an output signal of the frequency modulation circuit and a frequency demodulation circuit for frequency-demodulating an output signal of the delay circuit.

According to this analog delay circuit, a high resolution is realized since no clock is used for delaying of an analog signal and moreover a continuous control of the delay time is available by controlling the power voltage applied to the CMOS gate.

The fourth object of the invention is achieved by providing means for applying a signal reproduced from a recording medium to the delay circuit using the CMOS gate circuit and means for variably controlling the delay time of this delay circuit by time axis data of the reproduced signal thereby absorbing jitter.

According to this jitter absorption circuit, jitter can be absorbed by an electrical control such that the delay time is prolonged when the reproduced signal gains in the time axis direction whereas it is shortened when the reproduced signal is delayed. Hence a high-speed operation is possible as compared with the conventional mechanical control and the provision of the complicated mechanism for the tangential control can be obviated.

The fifth object of the invention is achieved by providing a delay circuit using the CMOS gate circuit for delaying a reproduced signal of a Compact Disc, means for detecting a synchronizing component (a signal corresponding to the rotation speed of the disc such as a frame synchronizing signal included in the reproduced signal or a reproduced clock signal produced from the reproduced signal) from the reproduced signal and means for controlling the delay time of the delay circuit in accordance with this detected synchronizing component.

According to this jitter absorption circuit, jitter can be absorbed by shortening the delay time when synchronizing of the reproduced signal is delayed and prolonging the delay time when synchronizing of the reproduced signal gains. Accordingly, the conventional jitter absorption memory can be obviated or reduced in size.

The sixth object of the invention is achieved by providing a circuit for detecting a synchronizing error between tracks of a magnetic tape, a delay circuit using the CMOS gate circuit for delaying reproduced signals with respect to each track and a control circuit for controlling the respective delay time of the delay circuit in response to the synchronizing error.

According to this fixed head type magnetic tape reproducing device, the synchronizing error can be corrected without adjusting azimuth of the magnetic head.

BRIEF DESCRIPTION OF THE DRAWINGS

In the accompanying drawings,

FIG. 5 is a diagram showing power voltage - delay time characteristics of a circuit in which the CMOS inverters 10 shown in FIG. 2 are cascade-connected in 80 stages;

FIG. 6 is an example of the circuit of FIG. 1 formed in an integrated circuit;

FIGS. 7 through 15 are respectively circuit diagrams showing other embodiments of the delay circuit according to the invention;

FIGS. 23a-23d are waveshape diagrams showing the operation of the circuit of FIG. 22;

FIG. 31 is a block diagram showing an embodiment of the jitter absorption circuit for the Compact Disc reproducing device according to the invention;

FIGS. 33 through 35 are block diagrams each showing another embodiment of the jitter absorption circuit for the Compact Disc reproducing device according to the invention;

FIG. 38 is a block diagram showing a specific example of the synchronizing detection circuit 316 in the circuit of FIG. 37;

FIG. 42 is a block diagram showing another embodiment of the fixed head type magnetic tape reproducing device according to the invention.

DESCRIPTION OF PREFERRED EMBODIMENTS

I. Delay Circuit utilizing a CMOS gate

Figure 2:
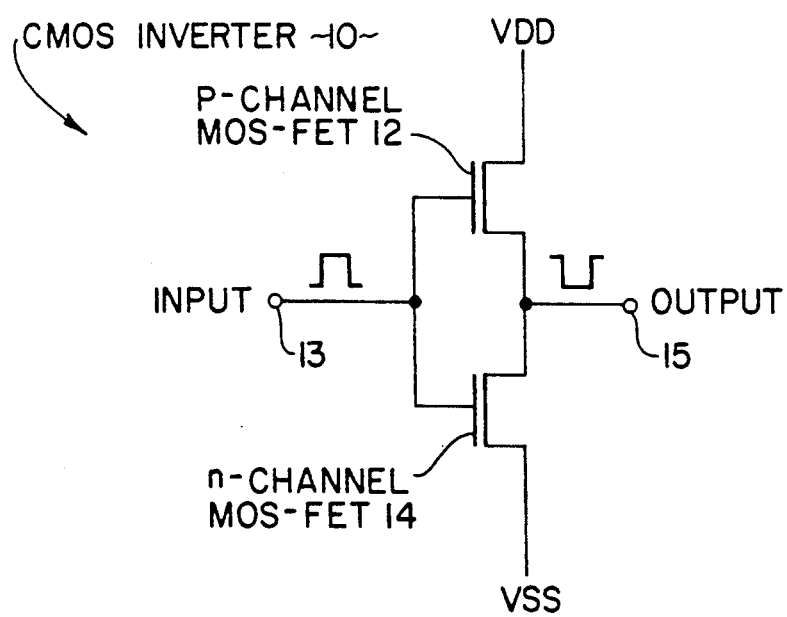
FIG. 2 is a circuit diagram showing a CMOS gate circuit.

An example of a CMOS gate is shown in FIG. 2. A p-channel MOS-FET 12 and an n-channel MOS-FET 14 are connected in their gates and drains together and power voltages $V_{DD}-V_{SS}$ are respectively applied to their sources. A signal is applied to their gates through an input terminal 13 and an inverted signal of the input signal is produced from an output terminal 15 through their drains.

Figure 3:
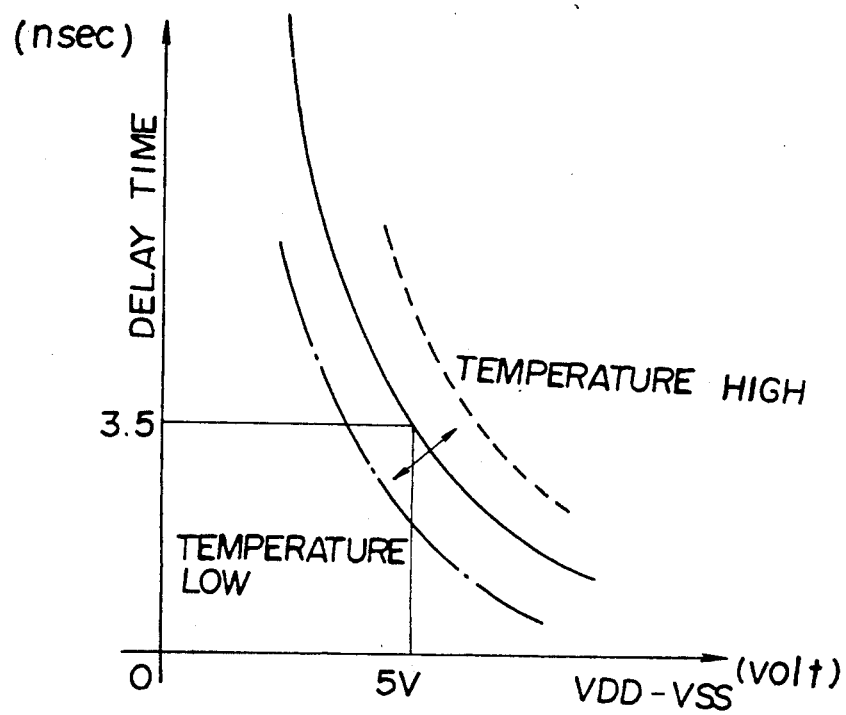
FIG. 3 is a diagram showing power voltage - delay time characteristics in the CMOS gate shown in FIG. 2.

In this CMOS inverter 10, there occurs a delay time between its input and output. This delay time depends, as shown in FIG. 3, upon the power voltage $V_{DD}-V_{SS}$. The smaller the power voltage $V_{DD}-V_{SS}$, the greater the delay time and the rate of change thereof. This is because conductance of the element changes depending upon the power voltage $V_{DD}-V_{SS}$. Accordingly, a desired length of delay time can be obtained by controlling the delay time in accordance with the magnitude of the power voltage $V_{DD}-V_{SS}$, utilizing the above described property.

Figure 4:
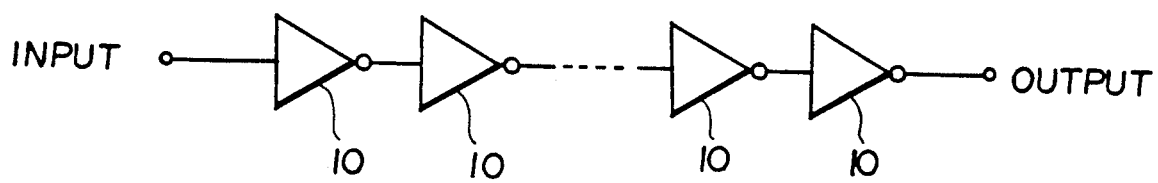
FIG. 4 is a circuit diagram showing a circuit capable of obtaining a long delay time by cascade-connecting CMOS inverters 10 of FIG. 2 in plural stages.

Further, if a plurality of the CMOS inverters 10 are cascade-connected as shown in FIG. 4, a longer delay time can be obtained. If, for example, delay time of about 3.5 (nsec) per stage is obtained at the power voltage $V_{DD}-V_{SS}$ of 5 (V) and the CMOS inverters 10 are connected in 8,000 stages, a delay time of $8,000 \times 3.5$ (nsec) $\approx 28$ ($\mu$sec) can be obtained. Power voltage $V_{DD}-V_{SS}$ v. delay time characteristics in case 80 CMOS inverters 10 are cascade-connected are shown in FIG. 5. It will also be noted from FIGS. 3 and 5 that the delay time of the CMOS inverter 10 depends also upon temperature, the delay time increasing as temperature rises to cause conductance change in elements.

Figure 1:
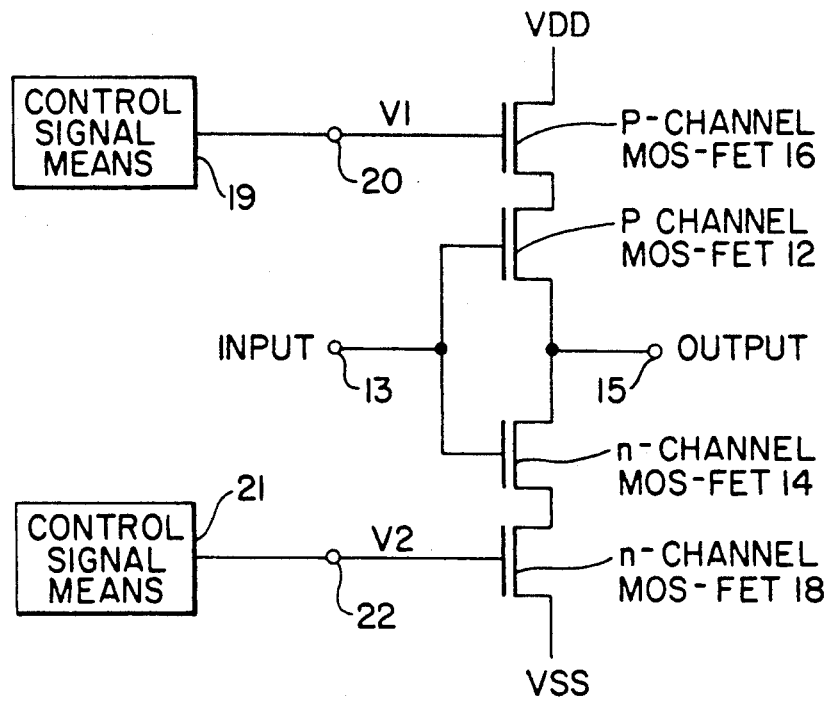
FIG. 1 is a circuit diagram showing an embodiment of the delay circuit according to the invention.

An embodiment of the invention is shown in FIG. 1. In this embodiment, delay time control elements are inserted between the CMOS gate and its power sources.

In FIG. 1, a p-channel MOS-FET 12 and an n-channel MOS-FET 14 are connected in their gates and drains together and a signal is applied to their gates and delivered out of their drains. A p-channel MOS-FET 16 and an n-channel MOS-FET 18 are inserted as delay time control elements between the source of the p-channel MOS-FET 12 and the power source $V_{DD}$ and between the source of the n-channel MOS-FET 14 and the power source $V_{SS}$. To the gates of the p-channel MOS-FET 16 and the n-channel MOS-FET 18 are applied control voltages v1 and v2 from control signal means 19 and 21 connected to terminals 20 and 22. These control voltages v1 and v2 are set at values which are symmetrical to the reference voltages $V_{DD}-V_{SS}$ (i.e., $V_{DD}-v1 = v2 - V_{SS}$). By controlling the values of the control voltages v1 and v2, voltages applied to the p-channel MOS-FET 12 and n-channel MOS-FET 14 which constitute the CMOS inverter are caused to change with resulting change in the delay time. The smaller the value of $V_{DD}-v1 = v2 - V_{SS}$, the greater the voltage applied to the MOS-FETs 12 and 14 and the smaller the delay time, while the greater the value of $V_{DD}-v1 = v2 - V_{SS}$, the smaller the voltage applied to the MOS-FETs 12 and 14 and the greater the delay time.

An example of the circuit of FIG. 1 formed in an integrated circuit pattern is shown in FIG. 6. By using this integrated circuit pattern, the multi-stage connection can be facilitated.

Figure 7:
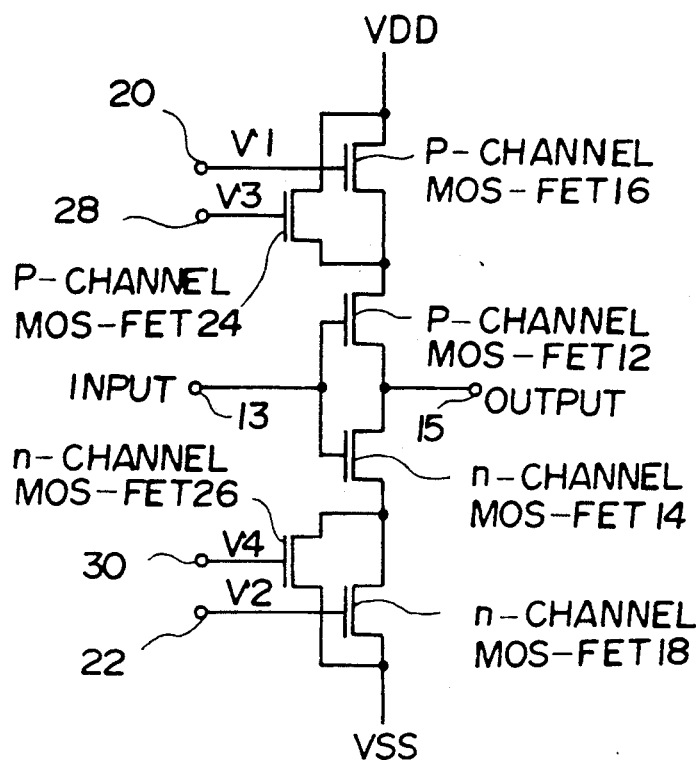

FIG. 7 shows an embodiment in which the delay time control elements are provided in two channels. In this embodiment, a p-channel MOS-FET 24 and an n-channel MOS-FET 26 are connected in parallel to the p-channel MOS-FET 16 and n-channel MOS-FET 18 in the circuit of FIG. 1. To the gates of the p-channel MOS-FET 24 and n-channel MOS-FET 26 are applied control voltages v3 and v4 from terminals 28 and 30. The delay time can be controlled in two systems by the voltages v1 and v2 from the terminals 20 and 22 and the voltages v3 and v4 from the terminals 28 and 30. This embodiment can be utilized in a case where, for example, coarse control signals are applied to the terminals 20 and 22 and fine control signals are applied to the terminals 28 and 30. The two channel control voltages may be separately applied by means of manual operation or control voltage generating circuit. This two channel control may be applied so that one channel is used for stabilization control of the delay time against the variations of the power voltages $V_{DD}$, $V_{SS}$ and the temperature, while the other channel is used for variable control of the delay time.

Figure 8:
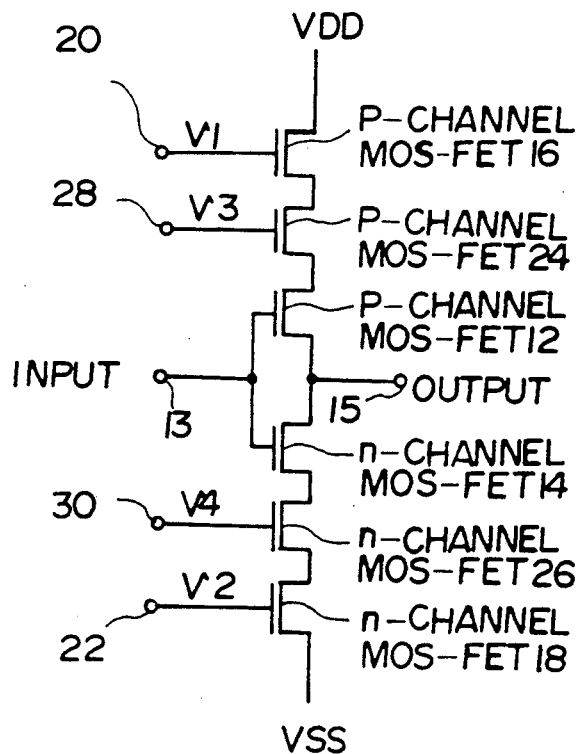

FIG. 8 shows an embodiment in which the p-channel MOS-FET 16 and the p-channel MOS-FET 24 on one hand and the n-channel MOS-FET 18 and n-channel MOS-FET 26 on the other are respectively connected in series. In this embodiment also, the delay time can be controlled in two channels by the voltages v1 and v2 applied to the terminals 20 and 22 and the voltages v3 and v4 applied to the terminals 28 and 30.

FIG. 9 shows an embodiment in which the invention is applied to CMOS inverters 10-1 through 10-n connected in plural stages. In these CMOS inverters, a drain output of a preceding stage is applied to a gate of a next stage. The power voltages $V_{DD}$ and $V_{SS}$ are supplied to the respective p-channel MOS-FET's 12 and the n-channel MOS-FET's 14 constituting the CMOS inverters 10-1 through 10-n via the p-channel MOS-FET 16 and the n-channel MOS-FET 18. According to this construction, the delay time can be controlled by the delay time control MOS-FET's 16 and 18.

FIG. 10 shows an embodiment in which the invention is applied to an arrangement of the CMOS inverters 10-1 through 10-n of plural stages formed in an integrated circuit 31. The delay time control elements are connected to the exterior of the integrated circuit 31. More specifically, the p-channel MOS-FET 16 and n-channel MOS-FET 18 are connected to power source terminals 32 and 34 which in turn are connected to the sources of the CMOS inverters 10-1 through 10-n and the power voltages $V_{DD}$ and $V_{SS}$ are applied to the CMOS inverters 10-1 through 10-n via the MOS-FET's 16 and 18.

Figure 11:
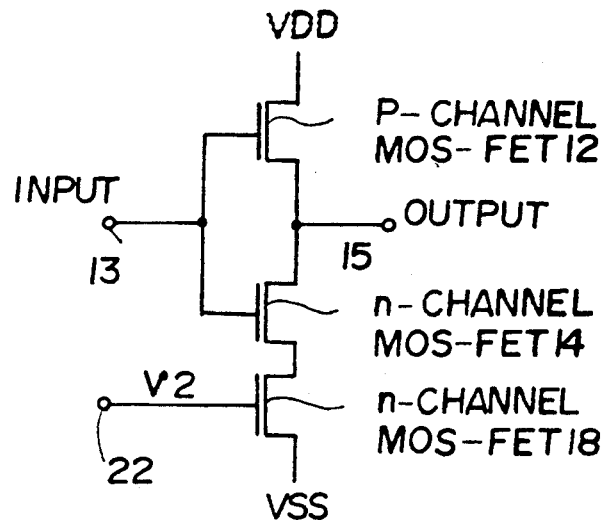

In the above described embodiments, the control elements are provided on both sides of the power sources. A similar effect can be obtained by providing the control element on one side only. FIG. 11 shows one example of such construction. This embodiment is equivalent to the embodiment of FIG. 1 except that the p-channel MOS-FET 16 is deleted. The delay time control is effected by the n-channel MOS-FET 18 only. Similarly, it is possible to delete the n-channel MOS-FET 18 in the embodiment of FIG. 1.

Figure 12:
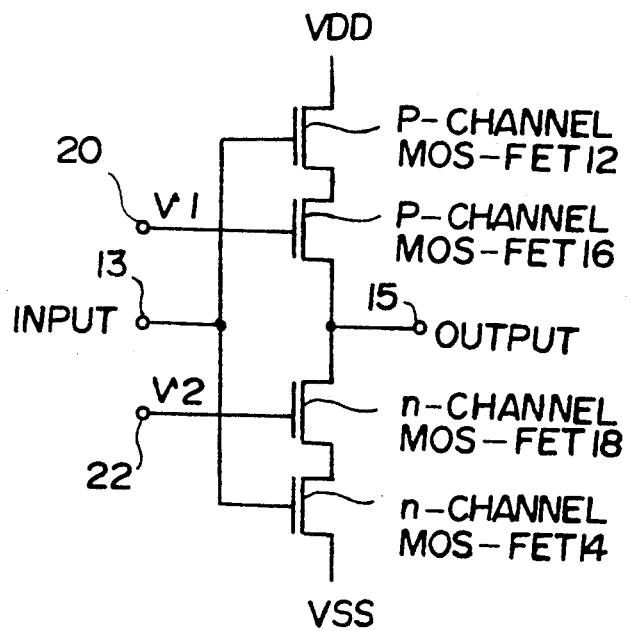

In the above described embodiments, the control elements are provided outside of the CMOS inverter. Alternatively, the control elements, however, may be provided inside of the CMOS inverter. FIG. 12 shows one example of such construction. In the construction of FIG. 12, the CMOS inverter is composed of the p-channel MOS-FET 12 and the n-channel MOS-FET 14 and the delay time control p-channel MOS-FET 16 and n-channel MOS-FET 18 are provided inside of this CMOS inverter.

Figure 13:
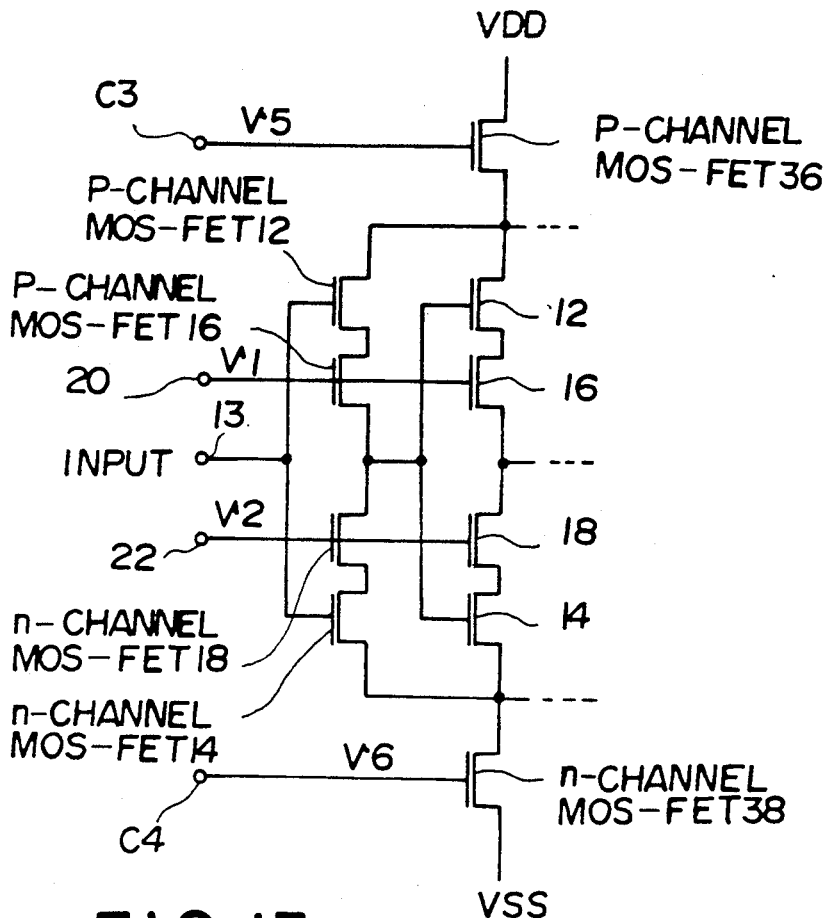

FIG. 13 shows an embodiment in which the circuits of FIG. 12 are connected in plural stages and the delay time control p-channel MOS-FET 36 and n-channel MOS-FET 38 are connected outside of these circuits. In this embodiment, the delay time is controlled by the two channels of voltages v1 and v2 applied to the gates of the MOS-FET's 16 and 18 and voltages v5 and v6 applied to the gates of the MOS-FET's 36 and 38 from terminals c3, c4.

Figure 14:
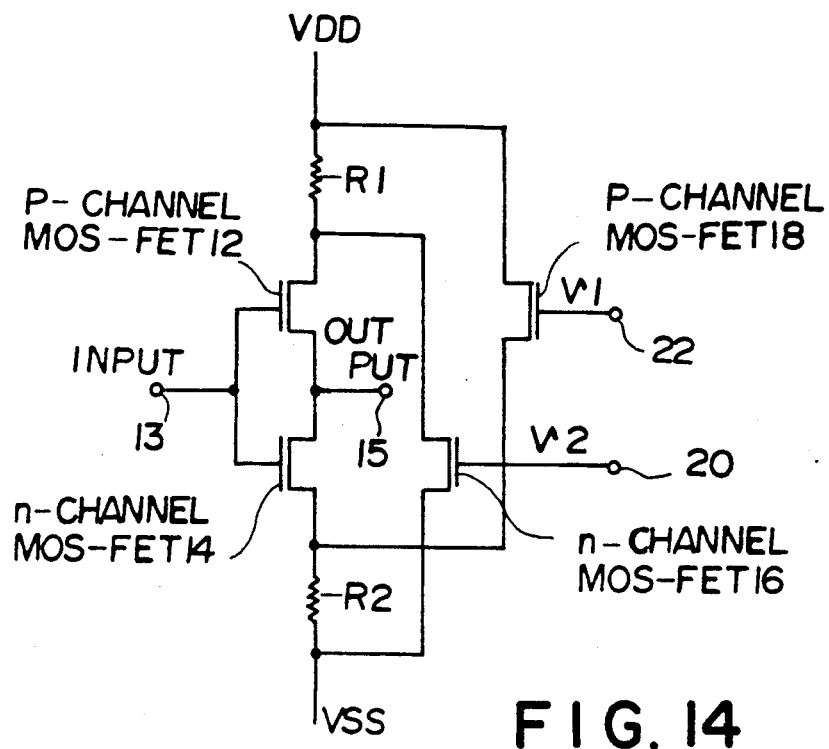

Instead of connecting the control elements to the MOS-FET's 12 and 14 constituting the CMOS inverter in series as in the foregoing embodiments, the control elements may be connected in parallel to these MOS-FET's. FIG. 14 shows one example of such construction. In FIG. 14, the sources of the p-channel MOS-FET 12 and n-channel MOS-FET 14 constituting the CMOS inverter are connected to the power source $V_{DD}$ and $V_{SS}$ via resistors R1 and R2, the delay time control n-channel MOS-FET 16 is connected in parallel to the p-channel MOS-FET 12, n-channel MOS-FET 14 and resistor R2, and the delay time control p-channel MOS-FET 18 is connected in parallel to the resistor R1, p-channel MOS-FET 12 and n-channel MOS-FET 14. The delay time is controlled by voltages v2 and v1 applied to the gates of the n-channel MOS-FET 16 and the p-channel MOS-FET 18. In this case, the relationship between change in the control voltages v1 and v2 and change in the delay time is reverse to the one in the embodiments of FIG. 13 and before.

Figure 15:
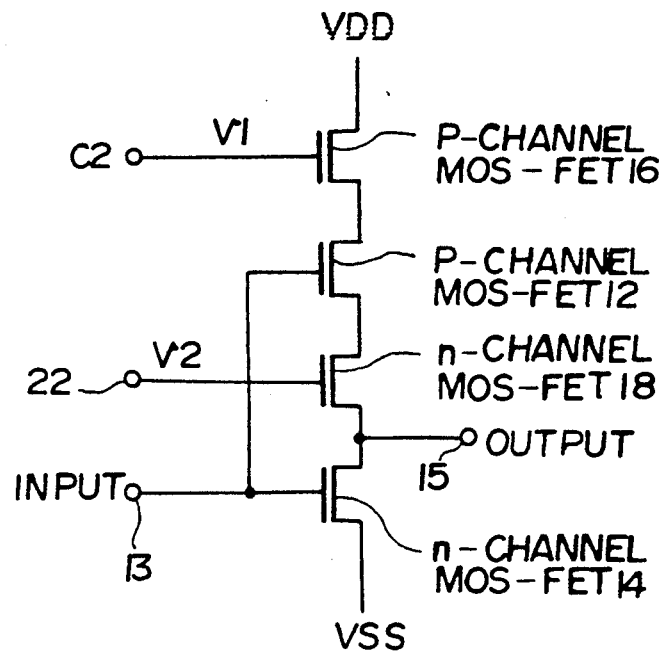

In the inverter shown in FIG. 15, a control n-channel MOS-FET 18 is inserted between MOS-FET's 12 and 14 constituting a CMOS inverter and a control p-channel MOS-FET 16 is inserted between the MOS-FET 12 and power source $V_{DD}$.

II. The delay time stabilizing circuit

Figure 16:
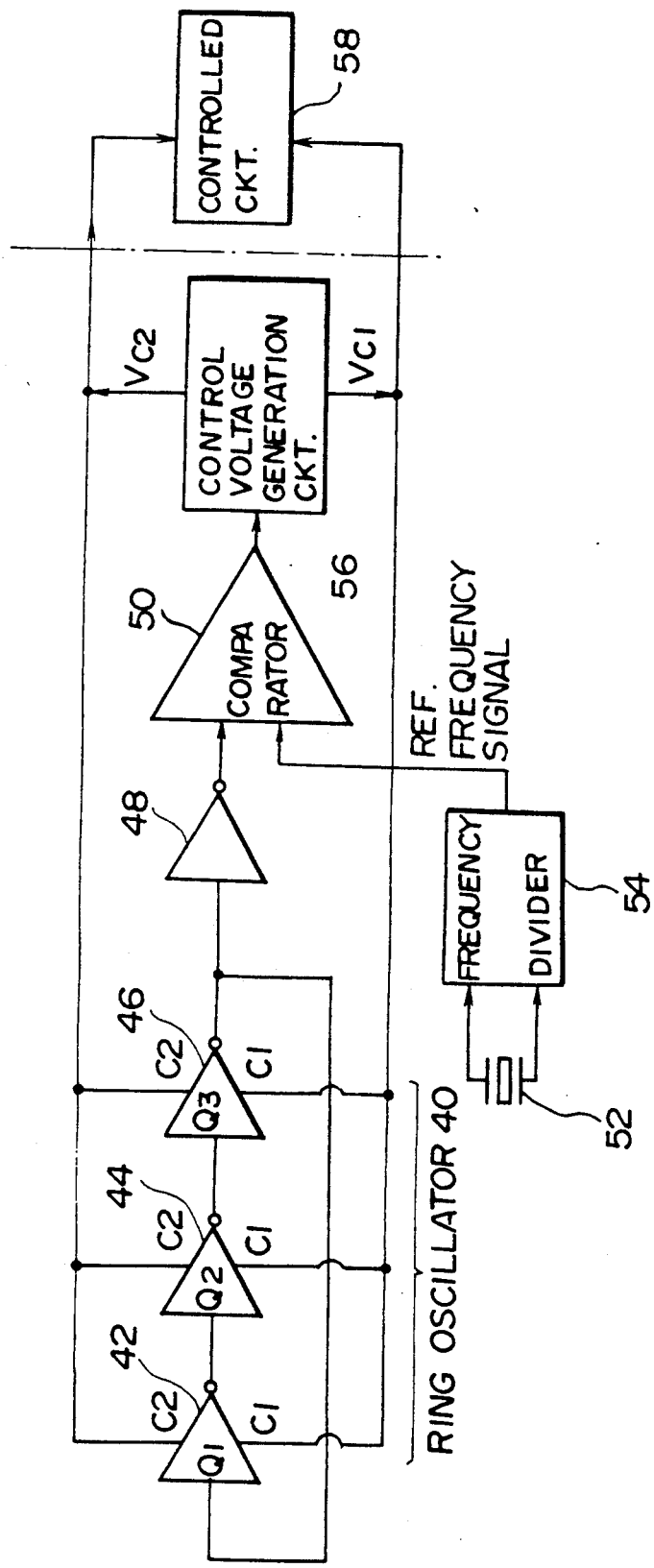
FIG. 16 is a circuit diagram showing an embodiment of the delay time stabilizing circuit according to the invention.

FIG. 16 shows an embodiment of the delay time stabilizing circuit according to the invention. This embodiment is designed for stabilizing the oscillation frequency of a ring oscillator and utilizing the control voltage used for this stabilization for stabilizing other circuits including a CMOS inverter.

In FIG. 16, a ring oscillator 40 utilizes delay characteristics of a CMOS inverter. Inverters 42, 44 and 46 of an odd number are cascade-connected and the output of the inverter 46 of the final stage is fed back to the inverter 42 of the initial stage. The oscillation frequency of the ring oscillator 40 is determined by the delay time of the open loop.

The oscillation output of the ring oscillator 40 is waveshaped by an inverter 48 and thereafter is applied to a comparator 50. The comparator 50 compares, in frequency and phase, this signal with a signal provided by frequency-dividing the output pulse of an oscillator 52 by a frequency divider 54 and produces a signal of a pulse width corresponding to the difference between the two signals.

In a control voltage generation circuit 56, DC voltages Vc1 and Vc2 are generated by smoothing the output pulse of the comparator 50. The DC voltages Vc1 and Vc2 are applied as control voltages to control input terminals c1 and c2 of the inverters 42, 44 and 46 which constitute the ring oscillator 40 to control the applied voltage thereof. Since delay characteristics of the inverters 42, 44 and 46 depend upon the applied voltages, PLL (phase-locked loop) is constructed by constituting a negative feedback loop in the above described loop with a result that a very stable oscillation frequency can be produced by the ring oscillator 40. In other words, the inverters 42, 44 and 46 are controlled to a constant delay time regardless of variations of the power voltage and temperature. The respective CMOS inverters in FIG. 16 can be constructed as shown in FIGS. 1 and 7 through 15.

Besides the stabilization of the oscillation frequency of the ring oscillator 40, if the control voltages Vc1 and Vc2 obtained in the above circuit are supplied as control voltages to other circuit, i.e., a controlled circuit 58 including inverters which is provided in an environment (e.g., temperature) equivalent to the inverters 42, 44 and 46 (e.g., on the same substrate of an integrated circuit), delay characteristics of this controlled circuit 58 can also be stabilized. As the controlled circuit 58, those as shown in FIG. 17 through 20 may be conceived.

Figure 17:
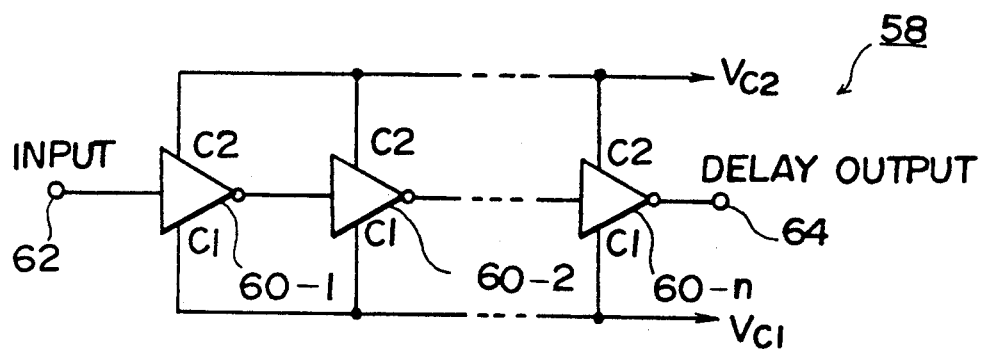
FIGS. 17 through 20 are circuit diagrams showing examples of controlled circuits 58 in FIG. 16 or 21.

FIG. 17 shows a delay circuit in which inverters 60-1, 60-2, ....., 60-n are cascade-connected, a signal is applied to an input terminal 62 and a delay output is provided from an output terminal 64. By controlling voltages applied to the inverters 60-1 through 60-n by means of the control voltages Vc1 and Vc2, the delay time can be maintained at a constant value.

Figure 18:
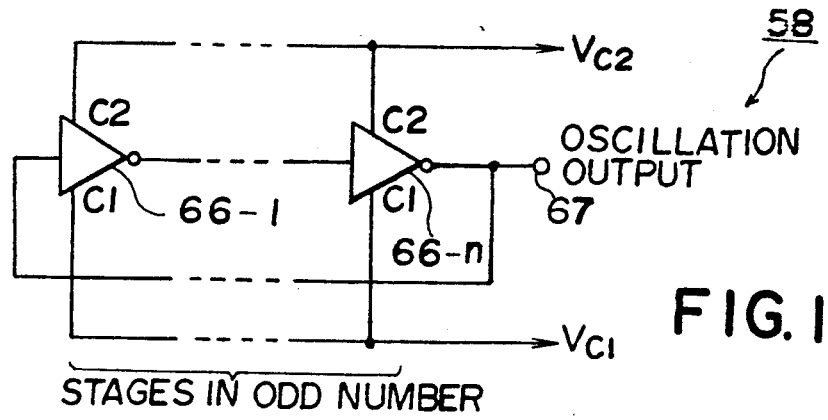

FIG. 18 shows a ring oscillator in which inverters 66-1, ....., 66-n are cascade-connected and an output of the inverter 66-n of the final stage is applied to the inverter 66-1 of the initial stage to produce an oscillation output from an output terminal 67. By controlling voltages applied to the inverters 66-1 through 66-n by the control voltages Vc1 and Vc2, the delay time of the inverters 66-1 through 66-n can be maintained at a constant value and the oscillation frequency can thereby be stabilized.

Figure 19:
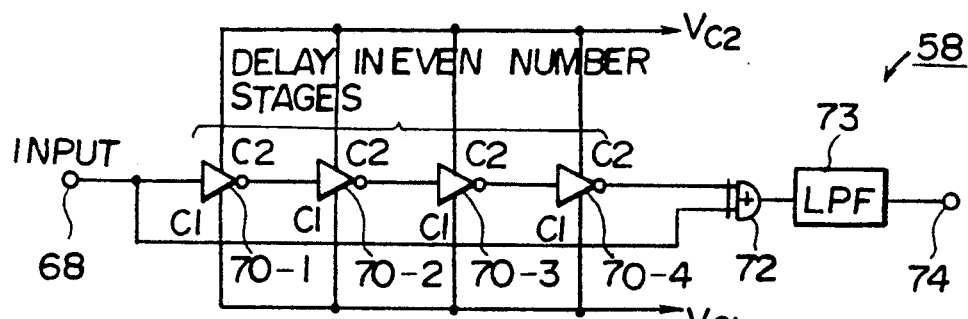

FIG. 19 shows an FM demodulation circuit (a pulse count detection circuit) which comprises cascade-connected inverters 70-1, 70-2, 70-3 and 70-4 of an even number (four in this example). A signal to be demodulated is applied to these inverters through an input terminal 68 and an output signal of the inverter 70-4 of the final stage is applied to an exclusive OR circuit 72. The output of the exclusive OR circuit 72 is taken out through a low-pass filter 73 and delivered to an output terminal 74 as a demodulated signal. An accurate demodulation with little distortion can be made by controlling voltages applied to the inverters 70-1 through 70-4 by the control voltages Vc1 and Vc2.

Figure 20:
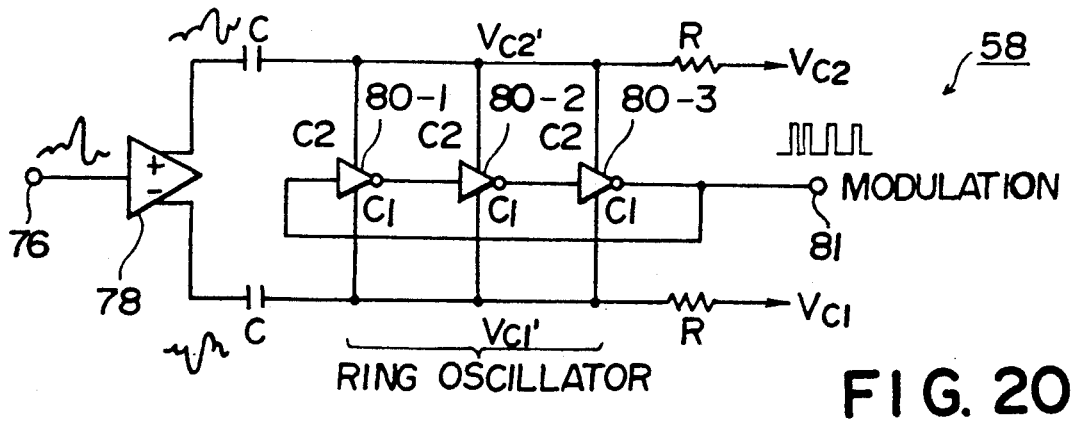

FIG. 20 shows an example of an FM modulation circuit. In this circuit, a signal to be modulated is applied from an input terminal 76 and supplied to an amplifier 78. Control voltages Vc1 and Vc2 are modulated by this input signal and the modulated control voltages Vc1' and Vc2' are used for controlling voltages applied to inverters 80-1, 80-2 and 80-3 constituting a ring oscillator whereby an FM modulated output is provided from the final stage inverter 80-3 to an output terminal 81. By the use of the above control voltages Vc1 and Vc2, an accurate modulation with little variation in the carrier frequency can be performed.

The respective CMOS inverters in FIGS. 17 through 20 can be constructed also as shown in FIGS. 1 and 7 through 15.

Figure 21:
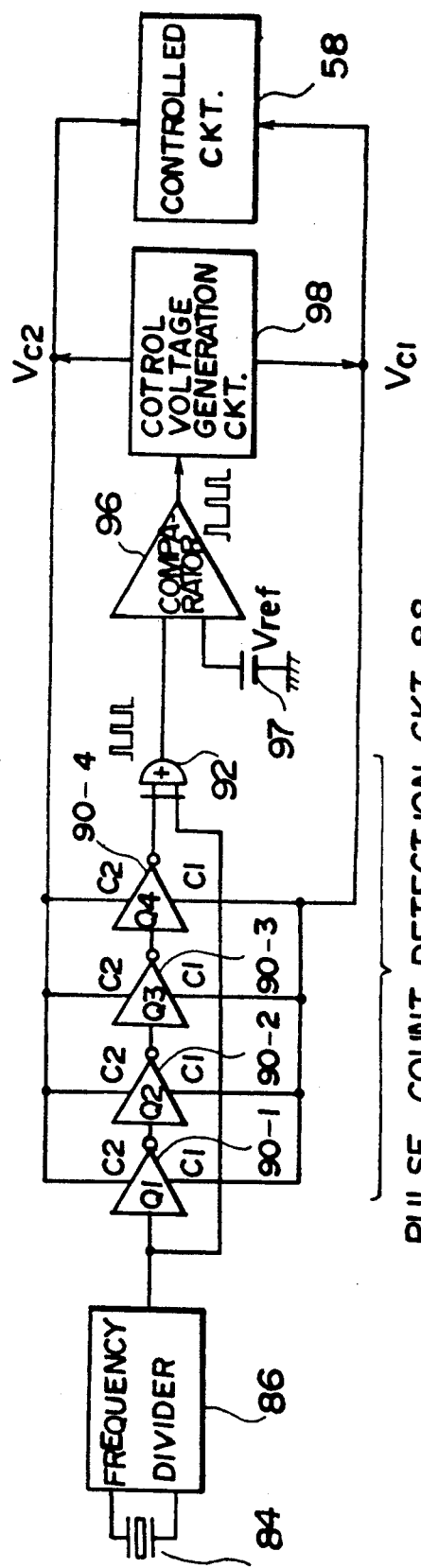
FIG. 21 is a circuit diagram showing another embodiment of the delay time stabilizing circuit.

Another embodiment of the delay time stabilizing circuit is shown in FIG. 21. In this embodiment, a pulse count detection circuit is utilized for stabilizing the delay time.

In FIG. 21, a reference signal generated by a crystal oscillator 84 is frequency-divided by a frequency divider 86 and thereafter is applied to a pulse count detection circuit 88. This circuit 88 comprises cascade-connected inverters 90-1 through 90-4. A frequency-divided signal from the frequency divider 86 is applied to the inverter 90-1 of the initial stage and the output of the inverter 90-4 of the final stage and the output of the frequency divider 86 are applied to an exclusive OR circuit 92. An output pulse from the exclusive OR circuit 92 undergoes change in its pulse width depending upon the delay time of the inverters 90-1 through 90-4.

The output pulse of the exclusive OR circuit 92 whose reference level undergoes change is compared with a constant reference voltage $V_{ref}$ of a reference voltage source 97 by a comparator 96 for eliminating the variation of its level by level shifting.

A control voltage generation circuit 98 smoothes the output pulse of the comparator 96 and thereby generates control voltages Vc1 and Vc2. These control voltages Vc1 and Vc2 are applied to control input terminals c1 and c2 of the inverters 90-1 through 90-4 to control voltages applied to these inverters. Since the delay characteristics of the inverters 90-1 through 90-4 depend upon the applied voltages as described above, a pulse of a constant pulse width is provided from the exclusive OR circuit 92 as a detection output by providing a negative feedback loop in the above described manner. That is, the delay time of the inverters 90-1 through 90-4 is controlled at a constant value regardless of the power voltage and temperature.

The control voltages Vc1 and Vc2 produced by the control voltage generation circuit 98 are applied to a controlled circuit 58. The controlled circuit 58 which is the control object consists of a circuit employing inverters such as a delay circuit, oscillation circuit, FM demodulation circuit and FM modulation circuit as shown in FIGS. 17 through 20. Accordingly, if the inverters employed in the controlled circuit 58 are formed in the same integrated circuit as the inverters 90-1 through 90-4, the inverters in the controlled circuit 58 are controlled commonly with the inverters 90-1 through 90-4 in the pulse count detection circuit 88 so that the delay time of the inverters in the controlled circuit 58 can be controlled at a constant value. Thus, the controlled circuit 58 operates in a stabilized state. Also in this embodiment, the inverters as shown in FIGS. 1 and 7 through 15 can be used.

III. The analog delay circuit

Figure 22:
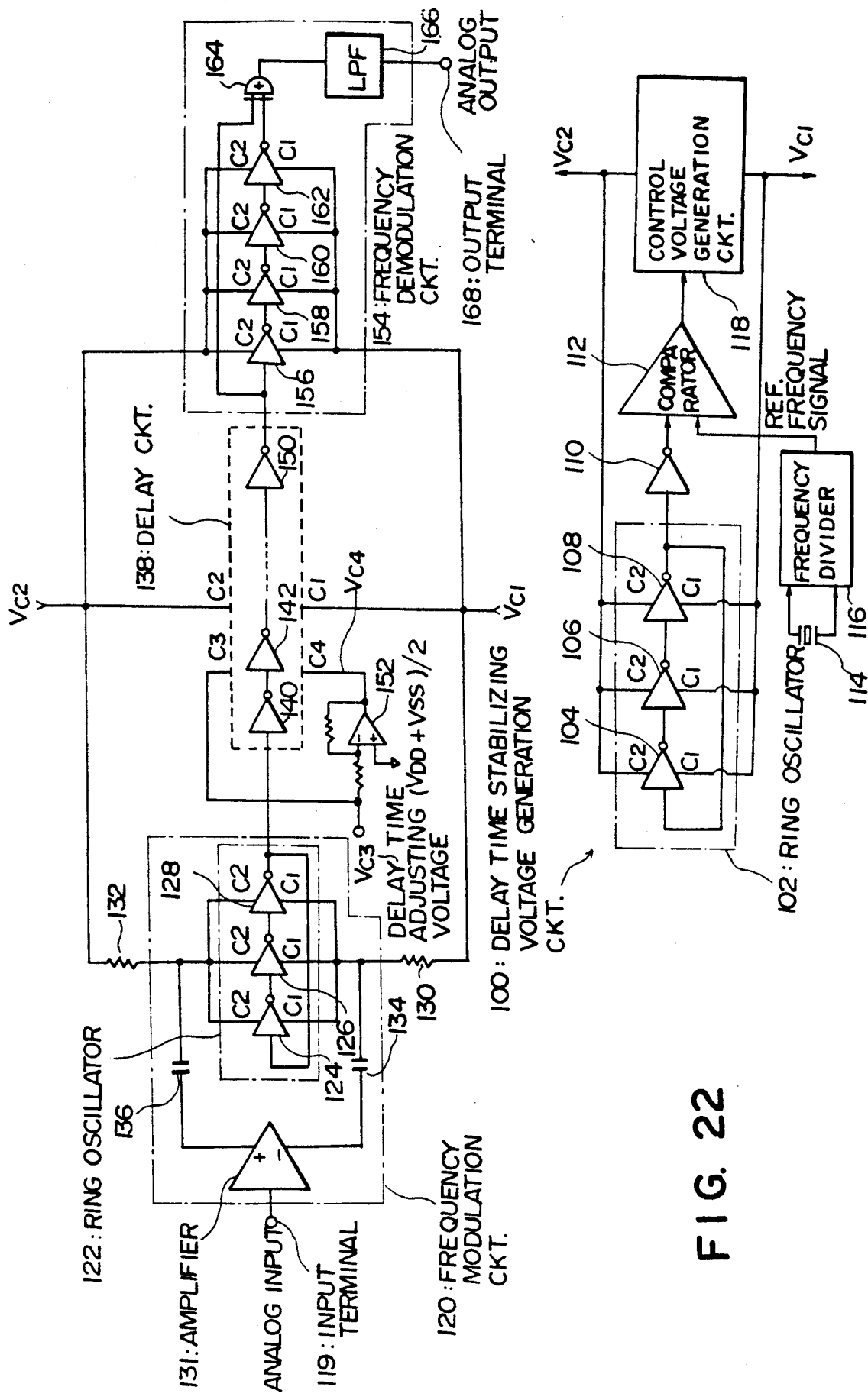
FIG. 22 is a circuit diagram showing an embodiment of the analog delay circuit according to the invention.

FIG. 22 shows an embodiment of the analog delay circuit according to the invention. In FIG. 22, all inverters are composed of CMOS inverters and are placed under conditions of the same temperature and power voltages $V_{DD}$ and $V_{SS}$ (e.g., on the same substrate). In FIG. 22, illustration of the power voltages $V_{DD}$ and $V_{SS}$ is omitted.

A delay time stabilizing voltage generation circuit 100 is a circuit provided for generating control voltages Vc1 and Vc2 which are used for providing a constant delay time to the respective inverters in FIG. 22. In the delay time stabilizing voltage generation circuit 100, a ring oscillator 102 utilizing the delay characteristics of the inverters is composed by cascade-connecting inverters 104, 106 and 108 of an odd number and feeding back the output of the final stage inverter 108 to the initial stage inverter 104. The respective inverters 104, 106 and 108 are constructed, for example, as the one shown in FIG. 1. Upon application of a signal "1" or "0" to the initial inverter 104, this signal is delayed through the inverters 104, 106 and 108 and a signal which is of an inverted level is provided from the final stage inverter 108 after lapse of a predetermined period of time. This signal is fed back to the initial stage inverter 104. Accordingly, the same operation is repeated with the input to the initial stage being inverted and oscillation thereby is produced. The oscillation frequency of the ring oscillator 102 is determined by the delay time of the open loop. Since the delay time of the inverters is controlled by the power voltage as described above, the oscillation frequency of the ring oscillator 102 is controlled by the inverters 104, 106 and 108.

The oscillation output of the ring oscillator 102 is waveshaped in an inverter 110 and thereafter is applied to a comparator 112. The comparator 112 compares, in phase and frequency, the output signal of the inverter 110 with a reference frequency signal obtained by frequency-dividing an oscillation signal of a crystal oscillator 114 by a frequency divider 116 and thereupon produces a pulse signal having a pulse width corresponding to difference of the two signals. A control voltage generation circuit 118 generates DC voltages Vc1 and Vc2 by smoothing the output pulse of the comparator 112. The DC voltages Vc1 and Vc2 are applied to control input terminals c1 and c2 of the inverters 104, 106 and 108 which constitute the ring oscillator 102 to control voltages applied thereto. Since the delay characteristics of the inverters 104, 106 and 108 depend upon the applied voltage, a phase-locked loop is constituted by the above described construction and a very stable oscillation frequency which is substantially equivalent to the reference frequency is obtained. In other words, the delay time of the respective inverters 104, 106 and 108 is controlled to a constant delay time regardless of variations in the power voltage and temperature.

By utilizing the control voltages Vc1 and Vc2 provided by the control voltage generation circuit 118 as control voltage for other inverters placed under the same temperature and power voltage ($V_{DD}$, $V_{SS}$) conditions, a delay which is not affected by the variations in temperature and power voltage can be realized.

The analog signal which is a signal to be delayed is applied from an input terminal 119 to an FM modulation circuit 120. The FM modulation circuit 120 comprises a ring oscillator 122 which is composed of cascade-connected inverters 124, 126 and 128 with the output of the final stage inverter 128 being fed back to the initial stage inverter 124. These inverters 124, 126 and 128 are constructed, for example, as the one shown in FIG. 1. To control inputs c1 and c2 of the inverters 124, 126 and 128 are applied the control voltages Vc1 and Vc2 for stabilizing the delay time through resistors 130 and 132. The analog signal applied from the input terminal 119 is superposed upon the control voltages Vc1 and Vc2 through an amplifier 131 and capacitors 134 and 136. Accordingly, voltages applied to the inverters 124, 126 and 128 are modulated by the input analog signal and a pulse signal of a frequency corresponding to the level of the input analog signal is produced from the ring oscillator 122. That is, a signal derived by pulse frequency-modulating the input analog signal is provided from the ring oscillator.

The output signal of the ring oscillator 122 is delivered out of the FM modulation circuit 120 and applied to a delay circuit 138. The delay circuit 138 is of a two-channel control system composed of cascade-connected inverters 140, 142, ..., 150. The construction as shown in FIG. 13 can preferably be employed as the delay circuit 138. One of the two control systems is used for controlling by the control voltages Vc1 and Vc2 for stabilizing the delay time. The other control system is used for adjusting the delay time by delay time adjusting voltage Vc3. The delay time adjusting voltage Vc3 is applied directly to a control input c3 (FIG. 13). This voltage Vc3 is also inverted by an inverting amplifier 152 using an intermediate voltage $V_{DD}+V_{SS}/2$ between the power voltage $V_{DD}$ and $V_{SS}$ as a reference to prepare voltage Vc4 (Vc4=$V_{DD}+V_{SS}$−Vc3) and this voltage Vc4 is applied to a control terminal c4 (FIG. 13).

In the above described manner, the delay time is continuously adjusted by the adjusting voltage Vc3.

The output of the delay circuit 138 is applied to a frequency demodulation circuit (i.e., pulse count detection circuit) 154. In the frequency demodulation circuit 154, a signal to be demodulated from the delay circuit 138 is applied to a circuit consisting of cascade-connected inverters 156, 158, 160 and 162 of an even number (four in the illustrated example), the output signal from the final stage inverter 162 is applied to an exclusive OR gate 164 and the output of the exclusive OR gate 164 is smoothed by a low-pass filter 166 and delivered to an output terminal 168 as a demodulated signal. By controlling voltages applied to the inverters 156 through 162 by the control voltages Vc1 and Vc2, an accurate, distortionless pulse frequency demodulation can be performed.

The operation of the circuit of FIG. 22 is shown in FIGS. 23a–23d. An analog signal as shown in FIG. 23a is applied to the input terminal 119. This signal is pulse frequency-modulated by the FM modulation circuit 120 into a signal as shown in FIG. 23b which has a frequency corresponding to the voltage level. The output signal of the FM modulation circuit 120 is delayed by the delay circuit into a signal as shown in FIG. 23c. This delayed signal is pulse frequency-demodulated by the frequency demodulation circuit 154 and a delay analog signal as shown in FIG. 23d is provided from the output terminal 168. The delay time T is variably controlled by the adjusting voltage Vc3. Since the delay time T of the respective inverters is controlled by control voltages Vc1 and Vc2 so as not to be affected by temperature and power voltages, a stable and accurate delay can be performed.

According to this analog delay circuit, an analog signal is delayed through the pulse frequency modulation, the delay by the CMOS gate and the pulse frequency demodulation. Since no sampling by a clock pulse as in the bucket-brigade device or charge-coupled device is required, delaying of a signal with a high resolution and therefore with little distortion can be realized. Further, the delay time can be continuously controlled by controlling voltage applied to the CMOS gate.

IV. The jitter absorption circuit (1)

Figure 24:
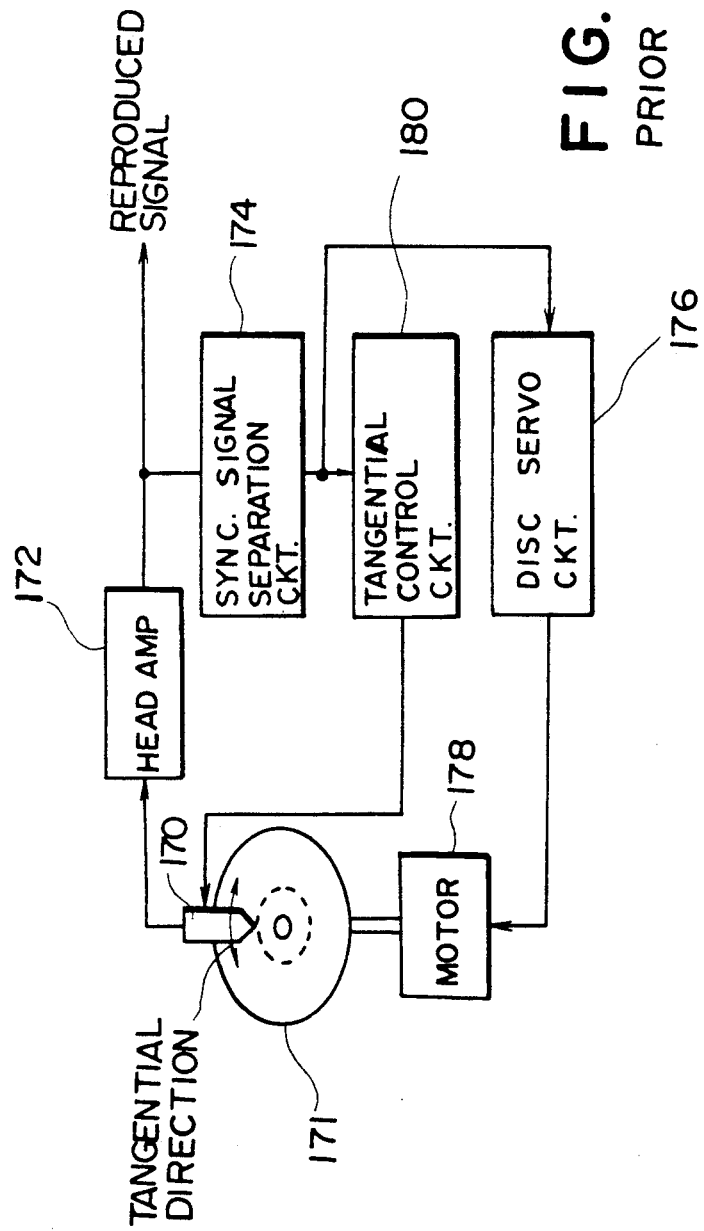
FIG. 24 is a block diagram showing a prior art jitter absorption circuit.

FIG. 24 shows an example of the prior art tangential control system. According to this system, a reproduced signal from a disc 171 provided by a pickup head 170 is applied through a head amplifier 172 to a synchronizing signal separation circuit 174 for separating a synchronizing signal. This synchronizing signal is applied to a disc servo circuit 176 to stabilize the rotation speed of a motor 178 and a small vibration in the tangential direction (jitter) is absorbed by moving the pickup head at a high speed in the tangential direction by a tangential control circuit 180.

This system requires a movable portion for the tangential control in the pickup head resulting in a very complicated construction of the pickup head. Such complicated construction makes it difficult to realize a construction with a small inertia which is ideal for the tangential control.

Figure 25:
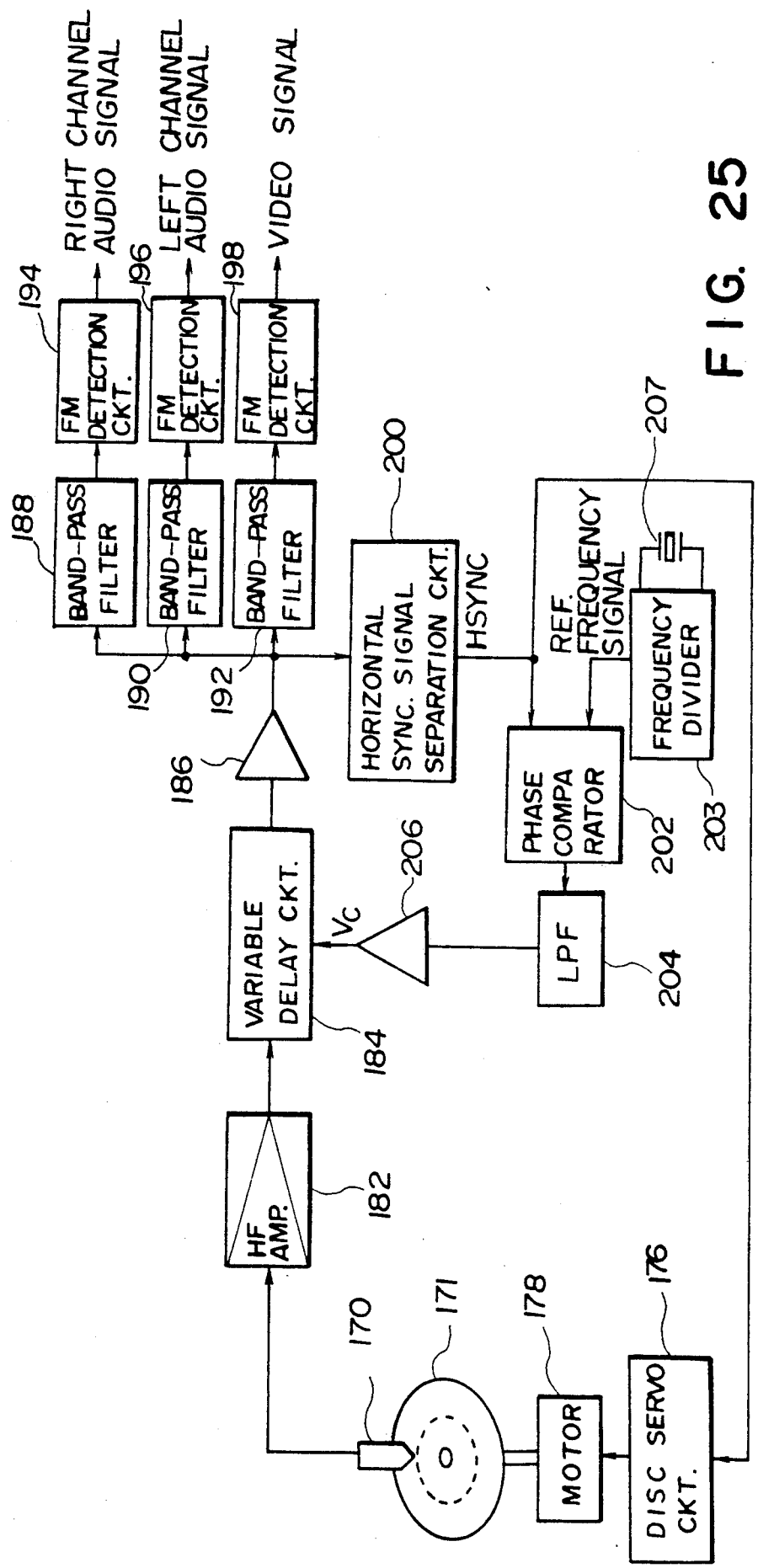
FIG. 25 is a block diagram showing an embodiment of the jitter absorption circuit according to the invention.

FIG. 25 shows an embodiment of the jitter absorption circuit according to the invention. In this embodiment, the invention is applied to a video disc player for reproducing a video signal from a video disc. It should be noted, however, that this jitter absorption circuit is applicable not only to the video disc player but to a reproducing device using a tape as a recording medium and any other reproducing devices in which a recording medium and a pickup head make a relative movement. Contents recorded on the recording medium are not limited to video information but the invention is applicable also to audio information and coded data.

In FIG. 25, on a disc 171 has recorded thereon pulse width modulated video, audio and synchronizing signals which can assume a continuous value along the time axis. A reproduced signal from the disc 171 picked up by the pickup head 170 is a signal containing a jitter or sway in the track direction which is too fast to be compensated by the disc rotation servo. This reproduced signal is applied to a variable delay circuit 184 through a high-frequency amplifier 182 and delivered from the delay circuit 184 imparted with a delay time which changes continuously in accordance with the control voltage Vc.

The output signal of the variable delay circuit 184 is passed through band-pass filters 188, 190 and 192 and FM detection circuits 194, 196 and 198 through a buffer amplifier 186 and provided as audio signals of left and right channels and a video signal.

The reproduced signal from the disc 171 containing a synchronizing signal is applied to a horizontal synchronizing signal separation circuit 200 in which the horizontal synchronizing signal HSYNC is separated. The separated horizontal synchronizing signal HSYNC is used for controlling a motor 178 through a disc servo circuit 176 to stabilize the rotation of the disc 171.

The horizontal synchronizing signal HSYNC is also compared by a phase comparator 202 in its phase with a reference frequency signal produced by frequency-dividing an oscillation signal of a crystal oscillator 207 by a frequency divider 203. The output signal of the phase comparator 202 is smoothed by a low-pass filter 204 and the control voltage Vc thus obtained is applied to a control input of the variable delay circuit 184 through a buffer amplifier 206. This loop constitutes a phase-locked loop and controls the delay time of the variable delay circuit 184 so that the horizontal synchronizing signal HSYNC synchronizes with the reference frequency signal. More specifically, when the reproduced signal is ahead of the reference position in the time axis direction, the delay time of the variable delay circuit 184 is prolonged by the control voltage Vc so as to delay the reproduced signal along the time axis.

When the reproduced signal is delayed from the reference position, the delay time of the variable delay circuit 184 is shortened by the control voltage Vc so as to gain the reproduced signal along the time axis. In this manner, jitter is absorbed.

The variable delay circuit 184 can be constructed, for example, by employing the CMOS inverters as shown in FIGS. 1 and 7 through 15.

Figure 26A:
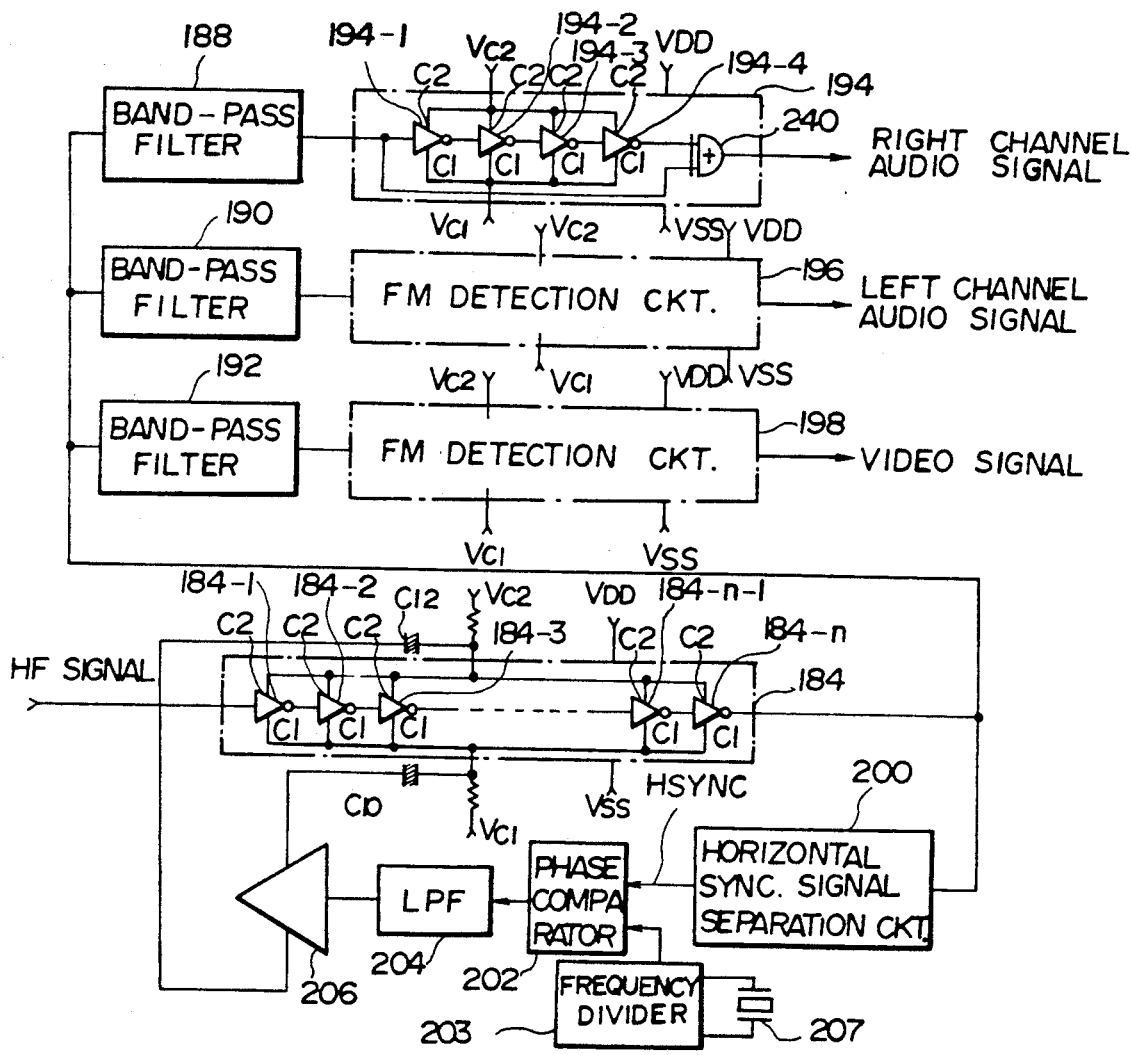
FIG. 26 is a circuit diagram showing a specific example of the circuit of FIG. 25.

A specific example of the jitter absorption circuit is shown in FIG. 26.

In FIG. 26, a power source circuit 210 converts a DC voltage to a constant voltage by a regulator 212 and produces power voltages $V_{DD}$ and $V_{SS}$ ($V_{SS}=0V$).

A delay time stabilizing circuit 214 controls voltages applied to the gate circuit so as to maintain the delay time of the gate circuit constant regardless of variations of temperature and power voltages $V_{DD}$ and $V_{SS}$.

In the delay time stabilizing circuit 214, a ring oscillator 216 utilizes delay characteristics of a CMOS inverter. Inverters 218, 220 and 222 of an odd number are cascade-connected and the output of the inverter 222 of the final stage is fed back to the inverter 218 of the initial stage. The respective inverters 218, 220 and 222 are composed, for example, of the CMOS inverters as shown in FIG. 1. The oscillation frequency of the ring oscillator 216 is determined by the delay time of the open loop.

The oscillation output of the ring oscillator 216 is waveshaped by an inverter 224 and thereafter is applied to a phase comparator 226. The phase comparator 226 compares, in frequency and phase, this signal with a signal provided by frequency-dividing the output pulse of a crystal oscillator 228 by a frequency divider 230 and produces a signal of a pulse width corresponding to the difference between the two signals.

The output pulse of the phase comparator 226 is smoothed by a low-pass filter 232.

In a control voltage generation circuit 234, control voltages Vc1 and Vc2 are generated in response to the output of the low-pass filter 232. The control voltages Vc1 and Vc2 are applied to control input terminals c1 and c2 of the inverters 218, 220 and 222 which constitute the ring oscillator 216 to control the applied voltage thereof. Since delay characteristics of the inverters 218, 220 and 222 depend upon the applied voltages, PLL (phase-locked loop) is constructed by constituting a negative feedback loop in the above described manner with a result that a stable oscillation frequency can be produced by the ring oscillator 216. In other words, the inverters 218, 220 and 222 are controlled to a constant delay time regardless of variations of the power voltage and temperature. The respective CMOS inverters in FIG. 26 can be constructed as shown in FIGS. 1 and 7 through 15.

Accordingly, if the entire circuit of FIG. 26 is constructed on the same substrate of the integrated circuit and power voltages $V_{DD}$, $V_{SS}$ and control voltages Vc1, Vc2 are commonly applied to the respective inverters, the delay time of each inverter becomes stabilized without being affected by the variations of temperature and power voltages $V_{DD}$ and $V_{SS}$.

A variable delay circuit 184 consists of cascade-connected inverters 184-1 through 184-n. The delay time is variably controlled by adding a jitter signal (AC signal) provided by a buffer amplifier 206 to the control voltages Vc1 and Vc2 through capacitors c10 and c12 and applying the resultant signal to the respective inverters 184-1 through 184-n.

An FM detection circuit 194 is composed by cascade-connecting inverters 194-1 through 194-4, applying an output of a band-pass filter 188 to the initial stage inverter 194-1 and applying an output of the final stage inverter 194-4 and the output of the band-pass filter 188 directly to an exclusive-OR gate 240. The voltages applied to the respective inverters 194-1 through 194-4 are controlled by the control voltages Vc1 and Vc2 applied to their terminals c1 and c2 so that a constant delay time will be maintained regardless of variations in temperature and the power voltages $V_{DD}$ and $V_{SS}$.

Figure 27:
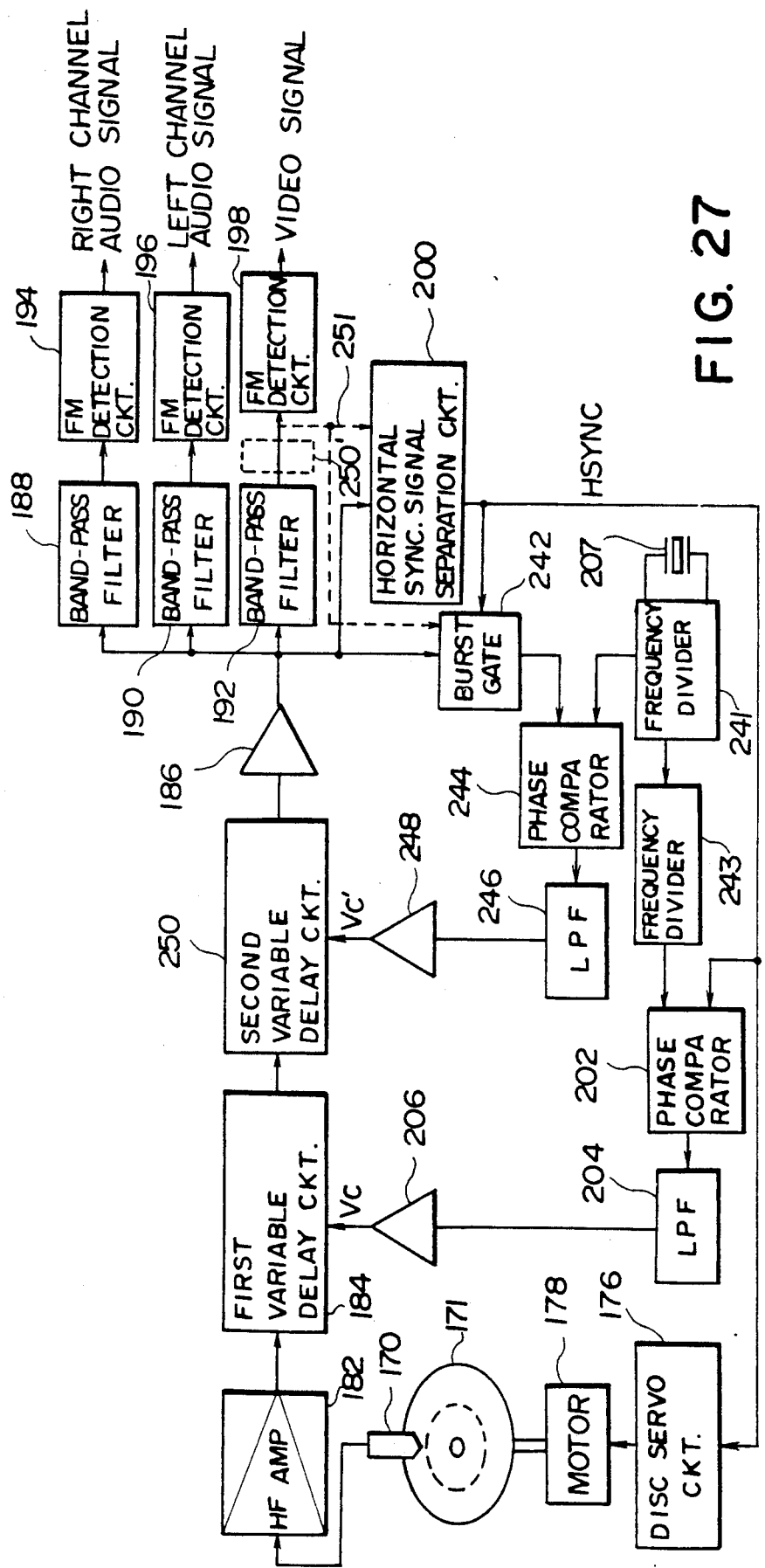
FIG. 27 is a circuit diagram showing another embodiment of the jitter absorption circuit according to the invention.

Another embodiment of the jitter absorption circuit is shown in FIG. 27. In this embodiment, the control in the time axis is doubly applied further by a color burst signal contained in the composite signal for obtaining even more accurate synchronization. In FIG. 27, the same component parts as those in FIG. 25 are designated by the same reference numerals.

In FIG. 27, a first variable delay circuit 184 is of the same construction as the variable delay circuit 184 in FIG. 25. A control voltage Vc obtained by comparing a horizontal synchronizing signal HSYNC with a reference frequency signal from a frequency divider 243 in a phase comparator 202 and smoothing the output of the comparator 202 by a low-pass filter 204 is applied to the first variable delay circuit 184 through a buffer amplifier 206.

Figure 28:
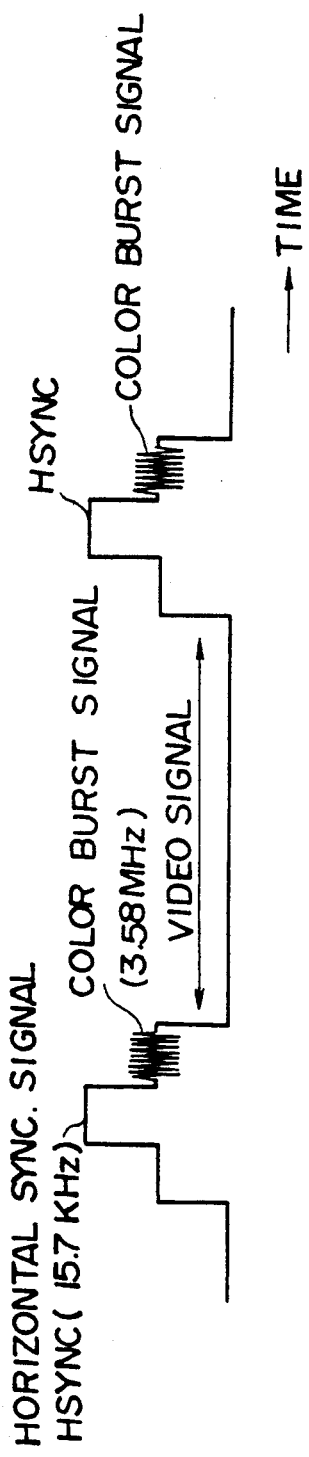
FIG. 28 is a waveshape diagram showing a horizontal synchronizing signal and a color burst signal.

A burst gate 242 extracts a color burst signal (3.58 MHz) from a reproduced signal by using the horizontal synchronizing signal HSYNC. The color burst signal is inserted in the back porch of the horizontal synchronizing signal HSYNC as shown in FIG. 28. A phase comparator 244 compares the extracted color burst signal with a reference frequency signal from a frequency divider 241 in phase. The output of the comparator 244 is smoothed by a low-pass filter 246 and thereafter is applied as a control voltage Vc' to a second variable delay circuit 250 through a buffer amplifier 248.

In the above described manner, the control in the time axis is applied doubly by the first variable delay circuit 184 and the second variable delay circuit 250 and an accurate synchronization is thereby achieved.

The second variable delay circuit 250 may be provided in a location shown by a dotted line 250' in FIG. 27. In this case, the output of the second variable delay circuit 250' is applied both to a horizontal synchronizing signal separation circuit 200 and the burst gate 242 as shown by a dotted line 251.

Figure 29:
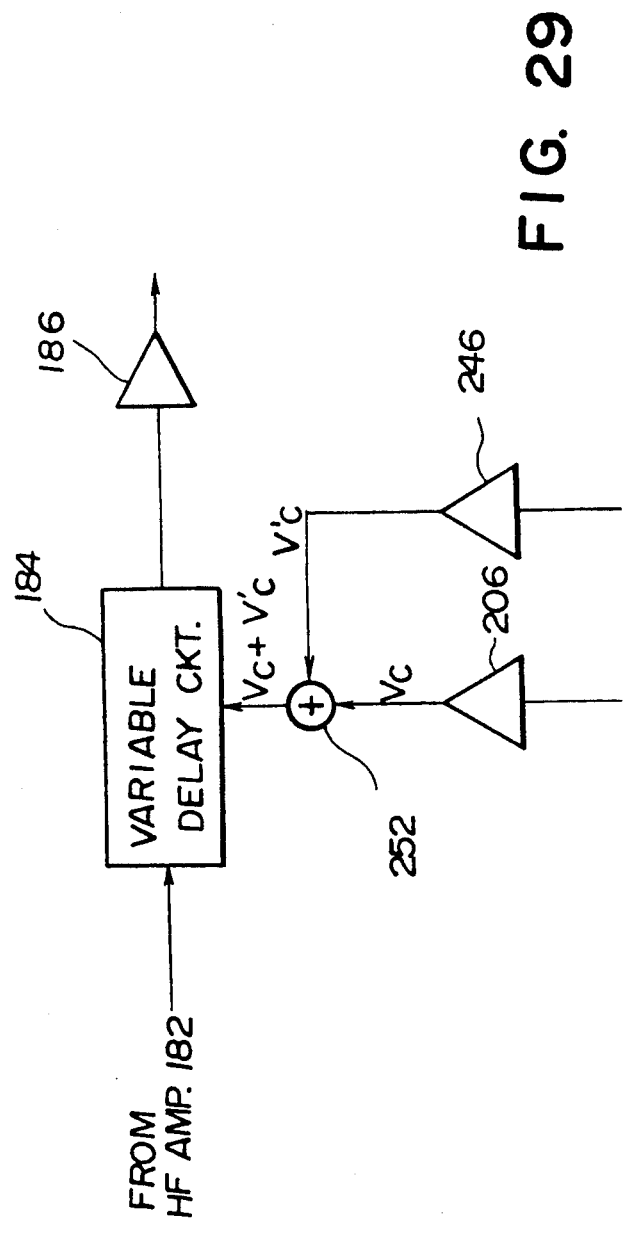
FIG. 29 is a circuit diagram showing another example of the circuit in which the time axis is doubly controlled by the horizontal synchronizing signal and the color burst signal.

As shown in FIG. 29, instead of providing the two variable delay circuits, the control voltage Vc and control voltage Vc' may be added together by an adder 252 and the added value Vc+Vc' may control a single variable delay circuit 184.

Alternatively, the variable delay circuit 184 itself may be constructed in such a manner that, as shown in FIG. 7 or 8, it has two control systems and control voltages v1, v2, and v3, v4 are applied to the respective control systems.

According to this jitter absorption circuit, jitter is absorbed by applying a reproduced signal from a recording medium to a delay circuit whose delay time is variable and variably controlling this delay time by time axis data of the reproduced signal. The conventional mechanical control is unnecessary and a high-speed and high-accuracy control is realized. Besides, a complicated mechanism for the tangential control need not be provided in the pickup head and, accordingly, the construction of the pickup head can be simplified.

V. The jitter absorption circuit (2)

Figure 30:
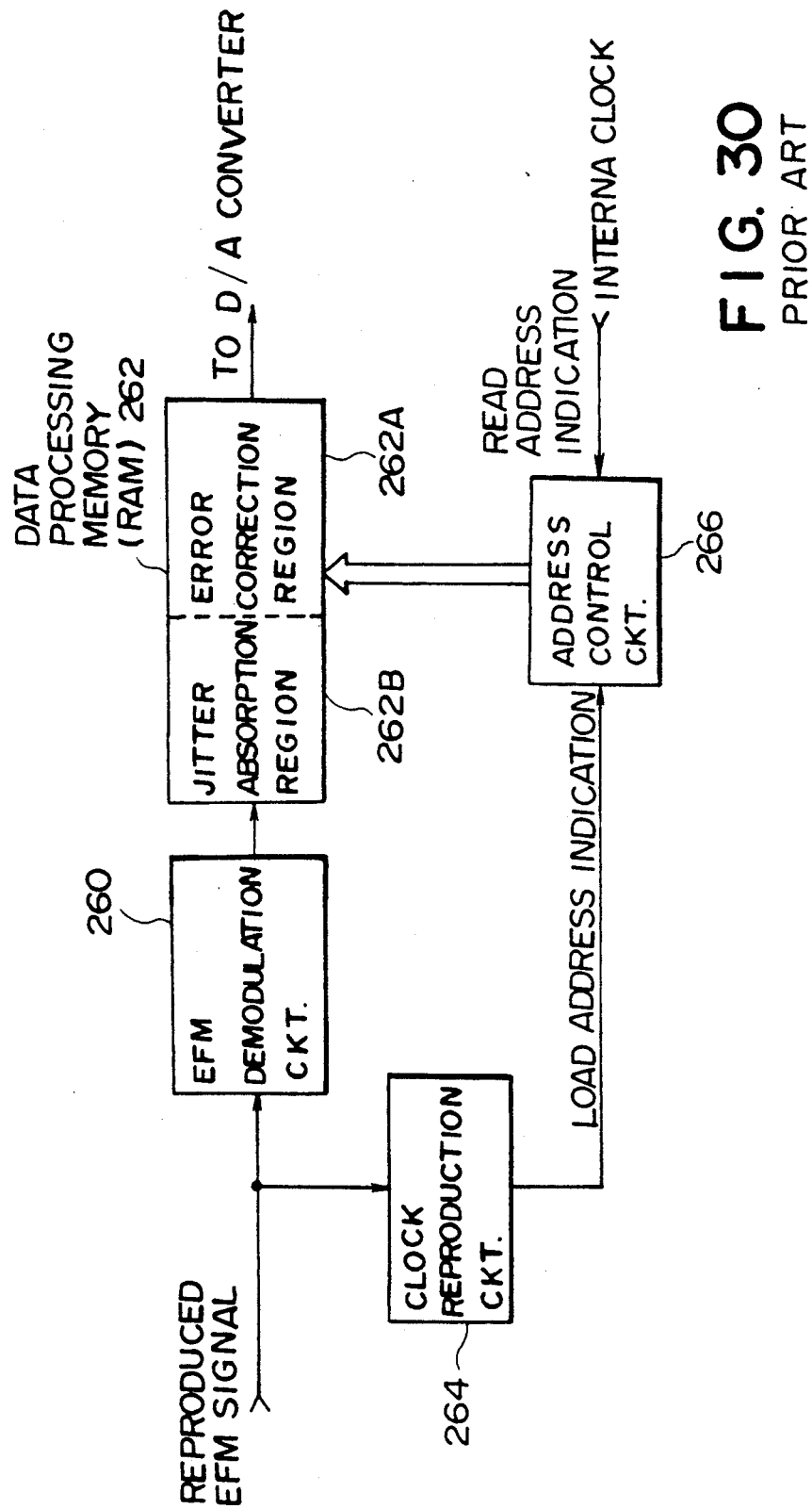
FIG. 30 is a block diagram showing a prior art Compact Disc reproducing device performing absorption of jitter by the jitter absorption memory.

In a Compact Disc, a jitter absorption circuit is used for preventing jitter which causes wow and flutter. An example of the conventional Compact Disc playback device including a jitter absorption circuit is shown in FIG. 30. In FIG. 30, a reproduced EFM signal is an original signal reproduced from the Compact Disc. This reproduced EFM signal is applied to a data processing memory 262 constructed by RAM (random access memory) through an EFM demodulation circuit 260. A clock reproduction circuit 264 reproduces a clock signal corresponding to change in the bits from the reproduced EFM signal. An address control circuit 266 loads an output signal of the EFM demodulation circuit 260 into the data processing memory 262 in response to the reproduced clock and reads it out in response to an internal clock (a signal prepared by a crystal oscillator output having a normal frequency (4.3218 MHz) of the reproduced clock). The reproduced EFM signal which has jitter when it is loaded into the data processing memory 262 is read out from the memory 262 by the internal clock having an accurate frequency after being once stored therein so that a reproduced signal having its jitter absorbed is provided from the data processing memory 262. The reproduced signal from the data processing memory 262 is delivered out as an audio output through a digital-to-analog converter (not shown).

The data processing memory 262 includes an error correction region 262A and a jitter absorption region 262B. This jitter absorption region 262B must have a large capacity so as to cope with jitter of a large magnitude.

An embodiment of the jitter absorption circuit according to the invention using the delay circuit utilizing the CMOS gate is shown in FIG. 31. In this embodiment, the delay time is controlled by a closed loop.

In FIG. 31, a reproduced EFM signal which is an original signal reproduced from a Compact Disc contains jitter due to instability of the drive system. The reproduced EFM signal is applied to an EFM demodulation circuit 260 through a variable delay circuit 268. A clock reproduction circuit 264 reproduces a clock signal in accordance with the reproduced EFM signal from the variable delay circuit 268. An address control circuit 266 loads the EFM demodulation signal into a data processing memory 262 in response to the reproduced clock and reads it out at a constant period in response to an internal clock prepared by a crystal oscillator output. The output signal of the data processing memory 262 is delivered out as an audio signal through a digital-to-analog converter (not shown).

A control circuit 270 compares the reproduced clock with the internal clock in phase and frequency and thereby controls the variable delay circuit 268. That is, when the reproduced clock is faster than the internal clock, the delay time is prolonged whereas when the reproduced clock is slower than the internal clock, the delay time is shortened. Thus, the delay time of the variable delay circuit 268 is controlled so that the reproduced clock synchronizes with the internal clock whereby jitter is absorbed. Accordingly, the jitter absorption region of the data processing memory 262 need not be of a large capacity. The jitter absorption region may even be omitted if the accuracy of the control of the delay time in the variable delay circuit 268 is sufficiently high. When the accuracy of the control is high, the internal clock as shown by a dotted line 272 may be employed as a load address command instead of the reproduced clock.

The variable delay circuit 268 may be constructed by using, for example, the CMOS inverters as shown in FIG. 1.

Figure 32:
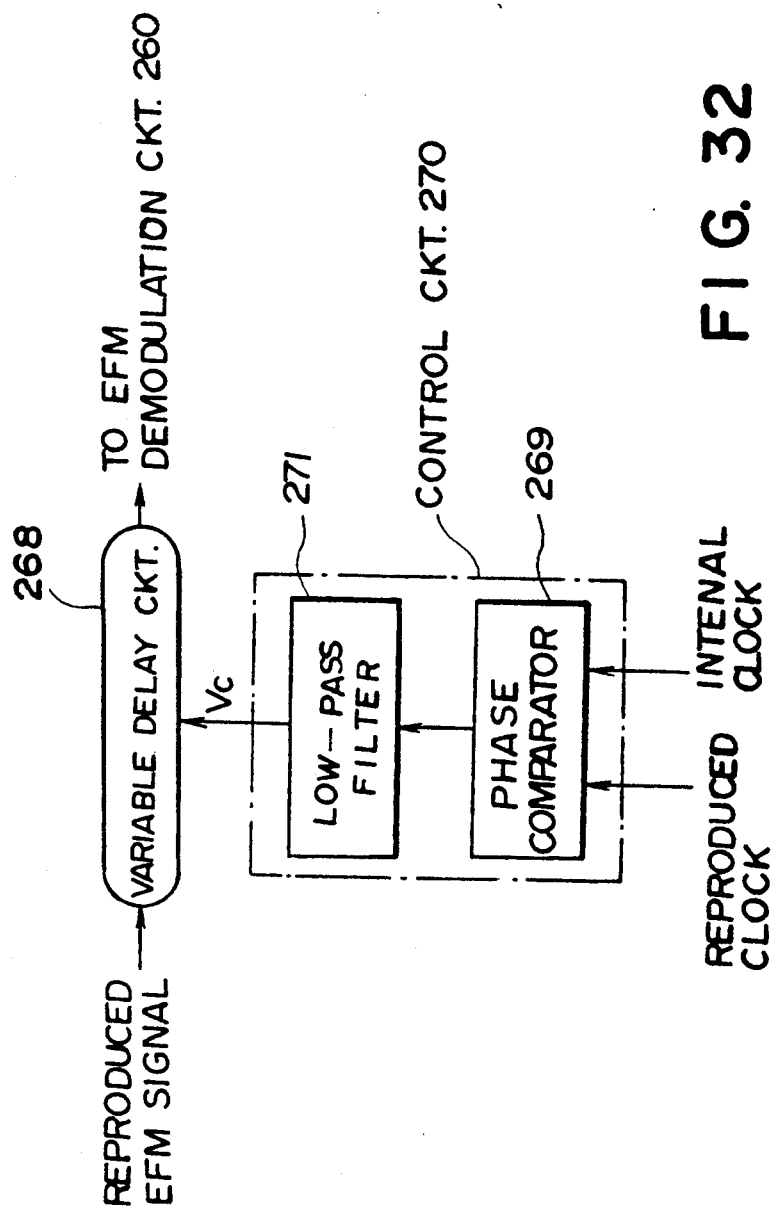
FIG. 32 is a block diagram showing an example of the control circuit 270 of FIG. 31.

A specific example of the control circuit 270 of FIG. 31 is shown in FIG. 32. The control circuit 270 of FIG. 32 comprises a phase comparator 269 which compares the reproduced clock with the internal clock and a low-pass filter 271 which smoothes the output of the phase comparator 269 and produces a control voltage Vc of a level corresponding to the direction and magnitude of phase difference of the reproduced clock relative to the internal clock.

Another embodiment of the jitter absorption circuit is shown in FIG. 33. In this embodiment, the delay time is controlled by an open loop.

In FIG. 33, the reproduced EFM signal is applied to an EFM demodulation circuit 260 through a variable delay circuit 268. A clock reproduction circuit 265 reproduces a clock signal from a reproduced EFM signal in a state before it is delayed. A control circuit 270 compares the reproduced clock with the internal clock in frequency and phase and produces a control voltage Vc corresponding to the phase difference between the two clocks and thereby controls the delay time of the variable delay circuit 268.

If the variable delay circuit 268 is constructed as shown in FIG. 1, when the phase of the reproduced clock is delayed from the internal clock, control voltages Vc, v1 and v2 decrease so that the delay time of the variable delay circuit 268 is shortened and the phase of the reproduced signal therefore gains. When the phase of the reproduced clock is ahead of the internal clock, the control voltages Vc, v1 and v2 increase so that the delay time of the variable delay circuit 268 is prolonged and the phase of the reproduced clock therefore lags. Thus, the variable delay circuit 268 produces a reproduced EFM signal which has its jitter absorbed completely and is synchronized accurately to the internal clock.

A clock reproduction circuit 264 reproduces a clock signal from the output of the variable delay circuit 268. An address control circuit 266 loads an output signal of the EFM demodulation circuit 260 into a data processing memory 262 in response to the reproduced clock from the clock reproduction circuit 264 and reads it out at a constant period in response to the internal clock. The signal produced by the data processing memory 262 is delivered out as an audio output through a digital-to-analog converter (not shown).

According to this embodiment, a reproduced EFM signal having its jitter absorbed is obtained from the variable delay circuit 268 so that the jitter absorption region in the data processing memory 262 may be reduced or even obviated.

If the accuracy of the control is sufficiently high, indication of the load address may be made by the internal clock as shown by a dotted line 263, omitting a load address indication channel leading from an output a of the variable delay circuit 268 to the address control circuit 266 via the clock reproduction circuit 264.

Figure 34:
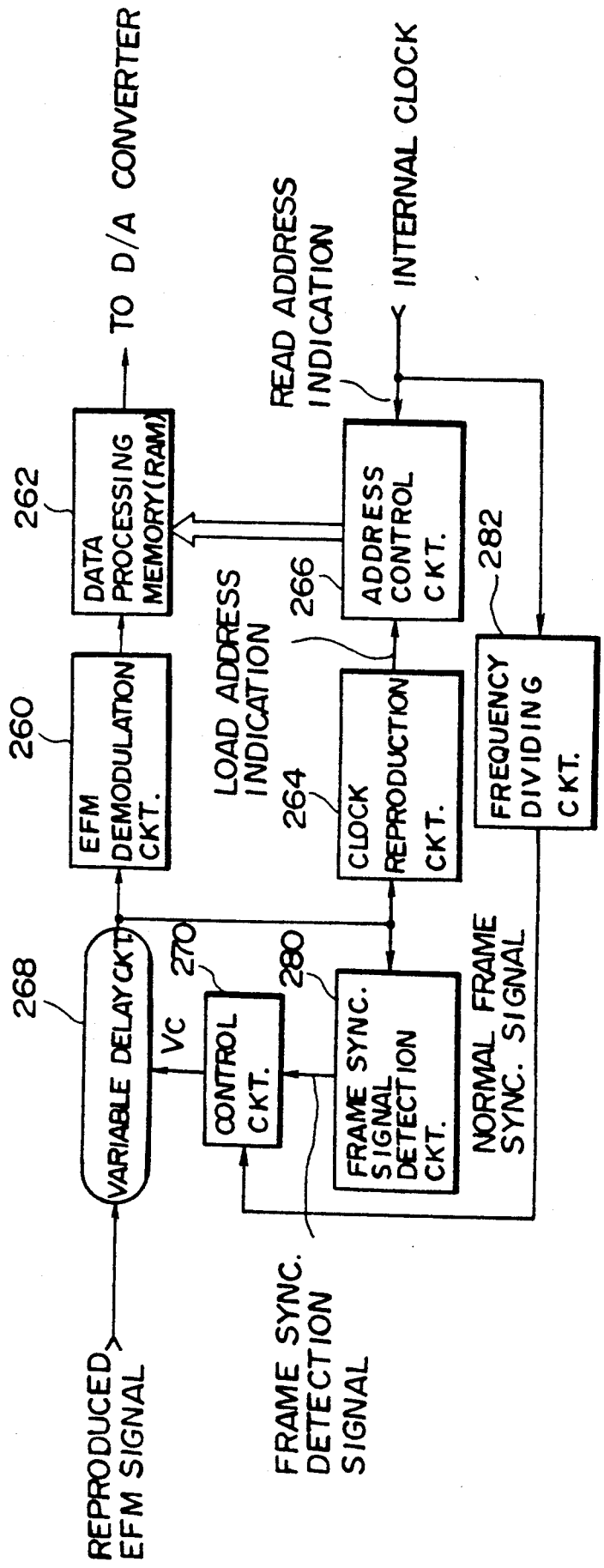

In the above described embodiments shown in FIGS. 31 and 33, the reproduced clock is used as a synchronizing component in the reproduced EFM signal. It is, however, possible to use as the synchronizing component a frame synchronizing signal which is formed at the beginning of each frame in the reproduced EFM signal. An example of the construction using the frame synchronizing signal is shown in FIG. 34. In the circuit of FIG. 34, the delay time is controlled by a closed loop. The reproduced EFM signal is applied to an EFM demodulation circuit 260 through a variable delay circuit 268. A frame synchronizing signal detection circuit 280 detects a frame synchronizing signal formed at the beginning of each frame in the reproduced EFM signal produced by the variable delay circuit 268. A frequency dividing circuit 282 frequency-divides an internal clock and thereby produces a signal (hereinafter called a normal frame synchronizing signal) having a frequency (7.35 KHz) corresponding to a normal frame synchronizing signal.

A control circuit 270 compares the detected frame synchronizing signal (hereinafter called a frame synchronizing detection signal) with the produced normal frame synchronizing signal in frequency and phase and thereby controls the delay time of the variable delay circuit 268. The variable delay circuit 268 is constructed, for example, as shown in FIG. 1. When the phase of the frame synchronizing detection signal is delayed from the normal frame synchronizing signal, control voltages Vc, v1 and v2 decrease so that the delay time of the variable delay circuit 268 is shortened and the phase of the frame synchronizing signal therefore gains. When the phase of the frame synchronizing detection signal is ahead of the normal frame synchronizing signal, the control voltages Vc, v1 and v2 increase so that the delay time of the delay circuit 268 is prolonged and the frame synchronizing signal therefore lags. Thus, the variable delay circuit 268 produces a reproduced EFM signal accurately synchronized with the normal frame synchronizing signal.

In the above described embodiments, either the reproduced clock or the frame synchronizing signal is used as the synchronizing component in the reproduced EFM signal. Alternatively, both the reproduced clock and the frame synchronizing signal may be used for the control so that a coarse control is performed by using the frame synchronizing signal and a fine control is performed by using the reproduced clock. An example of such two system control is shown in FIG. 35.

In FIG. 35, a clock reproduction circuit 264 reproduces a clock signal from a reproduced EFM signal provided by a variable delay circuit 268. A control circuit 270A compares the reproduced clock signal with an internal clock in phase and frequency and produces a control voltage Vc1 corresponding to the phase difference.

A frame synchronizing signal detection circuit 280 detects a frame synchronizing signal formed at the beginning of each frame of the reproduced EFM signal provided by the variable delay circuit 268. A frequency dividing circuit 282 frequency-divides an internal clock and thereby produces a normal frame synchronizing signal corresponding to a normal frame signal. A control circuit 270B compares the frame synchronizing detection signal with the normal frame synchronizing signal in phase and frequency and thereupon produces a control voltage Vc2 corresponding to the phase difference.

The variable delay circuit 268 is controlled in its delay time in the two systems of a coarse one and a fine one by the control voltages Vc1 and Vc2. In this manner, a reproduced EFM signal having its jitter absorbed is produced by the variable delay circuit 268 and applied to a data processing memory 262 through an EFM demodulation circuit 260. An address control circuit 266 loads an output signal of the EFM demodulation circuit 260 into the data processing memory 262 in response to a reproduced clock from the clock reproduction circuit 264 and reads out the loaded signal in response to the internal clock. The signal read out from the data processing memory 262 is delivered out as an audio output through a digital-to-analog converter (not shown). The variable delay circuit 268 controlled in the two systems is constructed, for example, as shown in FIG. 7 or 8.

The control voltage Vc1 (v1) produced from the reproduced clock is applied to the gate of the p-channel MOS-FET 16 provided as the control element while the control voltage Vc2 (v3) is applied to the gate of the p-channel MOS-FET 24 provided as the control element. A voltage Vc1' ($V_{DD}-Vc1 = Vc1' - V_{SS}$), i.e., v2, which is symmetrical to the control voltage Vc1 is applied to the n-channel MOS-FET 18 and a control voltage Vc2' ($V_{DD}-Vc=Vc2'-V_{SS}$), i.e., v4, which is symmetrical to the control voltage Vc2 is applied to the gate of the n-channel MOS-FET 26. Thus, both the coarse control by the frame synchronizing signal and the fine control by the reproduced clock can be realized. It should be noted that instead of the reproduced clock or the frame synchronizing signal, other synchronizing component may be utilized.

According to the jitter absorption circuit of the invention, jitter is absorbed by applying a reproduced signal from a Compact Disc to a variable delay circuit using the CMOS gate and controlling the delay time of the variable delay circuit in response to a detected synchronizing component from the reproduced signal so that the conventional jitter absorbing memory is obviated or reduced in size.

VI. The fixed head type magnetic tape reproducing device

This embodiment relates to a circuit for correcting a synchronizing error between signals reproduced from respective tracks occurring due to azimuth deviation of a magnetic head in a fixed head type magnetic tape reproducing device such as a multiple track PCM tape recorder.

Figure 36:
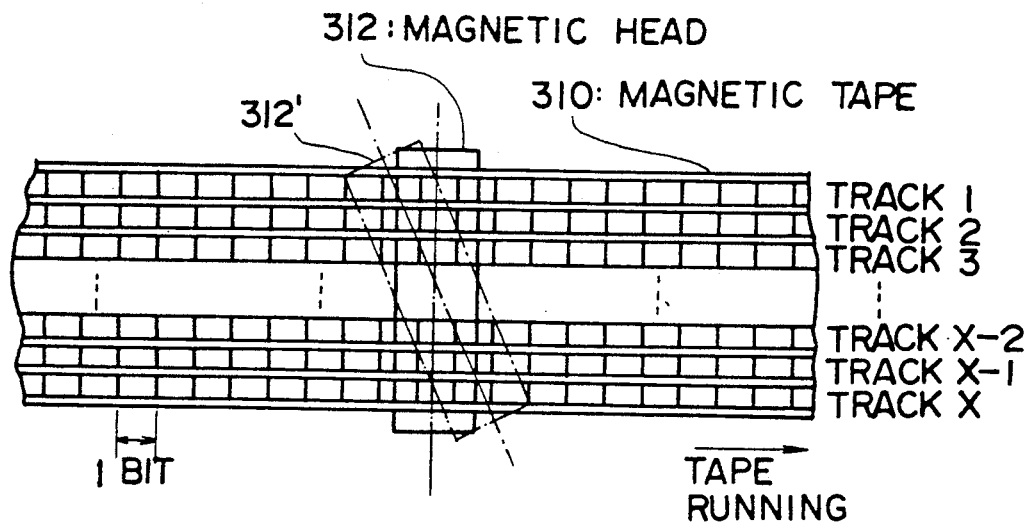
FIG. 36 is a diagram showing an azimuth error in a magnetic head.

In a multiple track PCM tape recorder, signals of respective tracks are synchronized in a direction normal to the running direction of the magnetic tape 310 as shown in FIG. 36. If, accordingly, azimuth deviation occurs due to inclination of a magnetic head 312 as shown by a chain line 312', a synchronizing error will occur between signals reproduced from the respective tracks resulting in occurrence of error in reproduced data. According to the invention, such synchronizing error can be corrected by delaying signals of the respective tracks in accordance with the amount of the synchronizing error.

Figure 37:
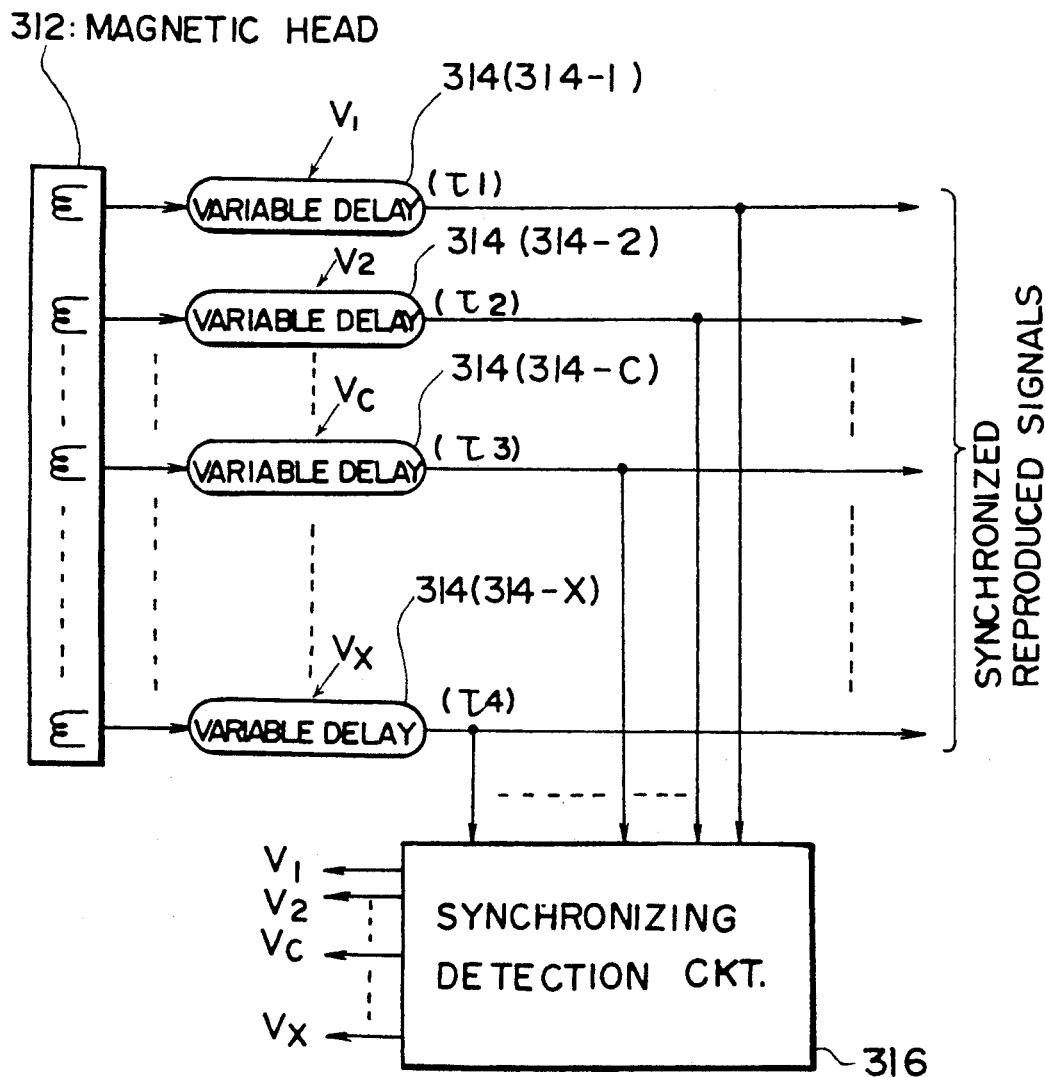
FIG. 37 is a block diagram showing an embodiment of the fixed head type magnetic tape reproducing device according to the invention.

An embodiment of the fixed head type magnetic tape reproducing device is shown in FIG. 37.

In FIG. 37, a multiple track type magnetic head (pickup head) 312 picks up data of the respective tracks of a magnetic tape 310. Reproduced signals of the respective tracks of the magnetic head 312 are provided through variable delay circuits 314 (314-1, 314-2, ..., 314-c, ..., 314-x). A synchronizing detection circuit 316 detects a synchronizing error between the reproduced signals of the respective tracks and thereupon produces a control signal Vi (i=1, 2, ..., c, x) for obtaining delay time required for correcting this synchronizing error.

Each of the variable delay circuits 314 is controlled in its delay time by a corresponding one of the control signals Vi and thereby provides a reproduced signal in which the synchronizing error has been corrected.

Figure 39:
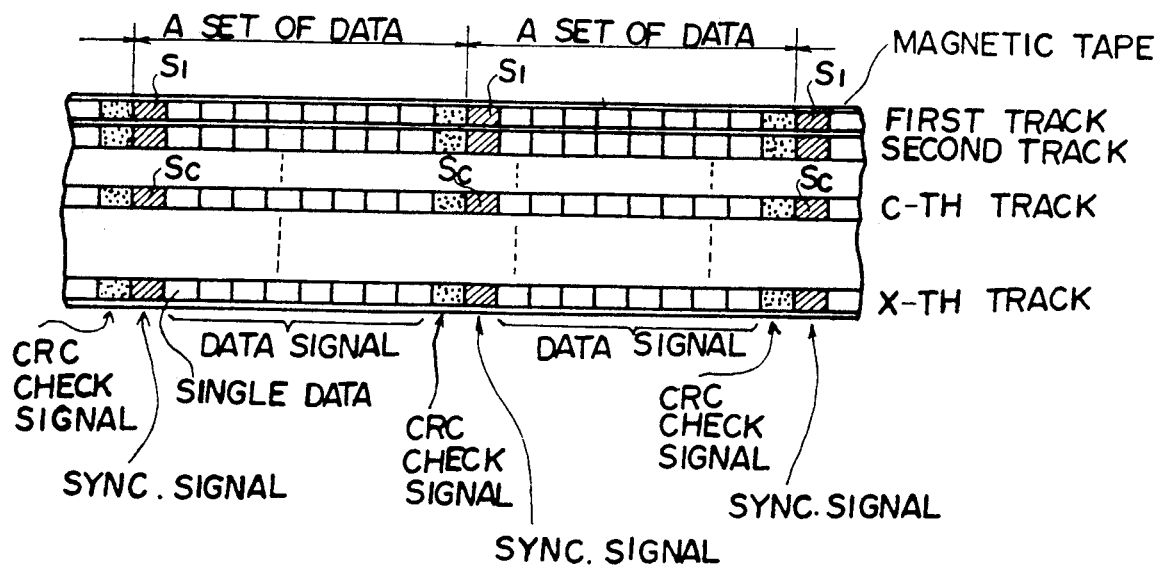
FIG. 39 is a diagram showing a record format of a multiple track PCM tape recorder.
Figure 40:
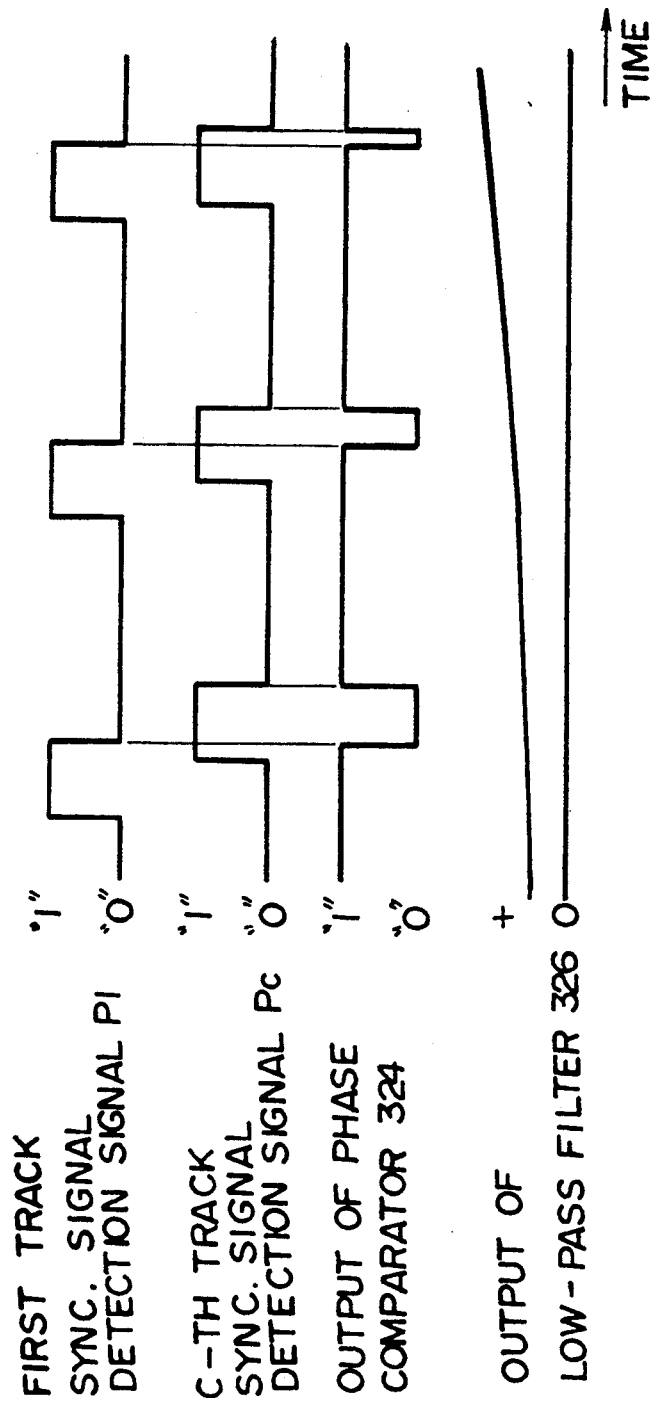
FIG. 40 is a time chart showing the operation of the synchronizing detection circuit 316 in the circuit of FIG. 38.

An example of the synchronizing detection circuit 316 is shown in FIG. 38. In FIG. 38, synchronizing signal detection circuits 320 and 322 receive output signals of variable delay circuits 314-1 of the first track and 314-c of the c-th track and detect synchronizing signals contained in the received signals. Data format of a fixed head type PCM tape recorder is formed in such a manner that, as shown in FIG. 39, a set of several data (samples) is distributed among the respective tracks, synchronizing signals of the same pattern are inserted at the beginning of the respective tracks and CRC check signals are inserted at the end of the respective tracks. Synchronizing signal detection circuits 320 and 322 detect a synchronizing signal S1 of the first track and a synchronizing signal Sc of the c-th track as shown in FIG. 39 and thereupon produces detection signals P1 and Pc as shown in FIG. 40.

A phase comparator 324 compares phases of the detected signals P1 and Pc and produces a pulse signal of a width corresponding to the phase difference. The output pulse of the phase comparator 324 is smoothed by a low-pass filter 326 and a signal of a polarity and level corresponding to the direction and magnitude of the synchronizing error as shown in FIG. 40 is provided by the low-pass filter 326.

A control signal generation circuit 328 computes, responsive to synchronizing error data supplied from the low-pass filter 326, delay times, $\tau1, \tau2, ..., \tau c, ..., \tau x$ of the respective delay circuits 314 required for correcting the synchronizing error and produces control signals v1, v2, Vc, ..., Vx required for obtaining the delay times $\tau1, \tau2, ..., \tau c, ..., \tau x$.

Figure 41:
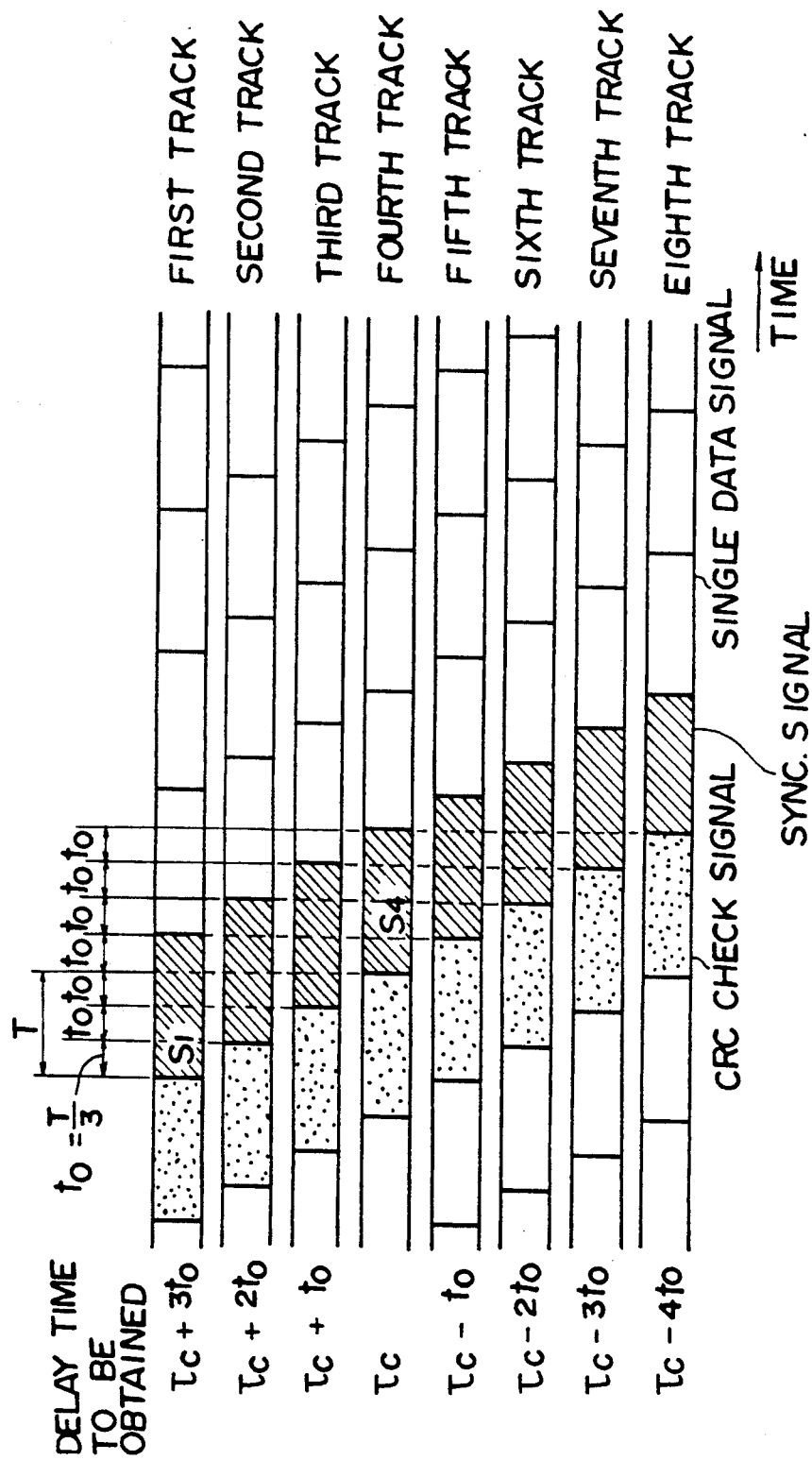
FIG. 41 is a time chart showing a state of synchronizing error between signals reproduced from respective tracks.

Explanation will now be made about the phase difference between the detected synchronizing signals S1 and Sc and delay times $\tau1, \tau2, ..., \tau c, ..., \tau x$ required for correcting the phase difference on the assumption that the number of tracks is eight. FIG. 41 shows states of reproduced signals of the respective tracks in a state where there is the synchronizing error. Shaded portions indicate synchronizing singals of the respective tracks.

Let us assume that a phase difference of time T has occurred between a synchronizing signal S1 of the first track and a synchronizing signal S4 of the fourth track which approximately is located in the center of the tape. Since the magnitude of the synchronizing error is uniform between respective adjacent tracks, time difference $t_0$ between respective adjacent tracks is obtained by dividing the time difference T by the number of locations where the synchronizing error has been detected between the tracks. In the example of FIG. 41, the synchronizing error has been detected between the first and fourth tracks and there are three locations of the synchronizing error so that the time difference $t_0$ between the adjacent tracks is T/3.

Delay times of the respective tracks are determined by fixing any one of them and adding or subtracting the time difference $t_0$ to or from this fixed delay time. It is most efficient if a central track for example is selected as the track for which the delay time is fixed and its delay time $\tau c$ is set at the middle of the range of variation of the delay time of the variable delay circuits.

If, for example, the delay time of the fourth track is fixed to $\tau c$, the synchronizing signal can be corrected by setting the delay times of the respective tracks as shown in the following table:

TABLE

| Track name | Delay time |
|---|---|
| first track | $\tau c + 3 t_0$ |
| second track | $\tau c + 2 t_0$ |
| third track | $\tau c + t_0$ |
| fourth track | fixed $t_0 \tau c$ |
| fifth track | $\tau c - t_0$ |
| sixth track | $\tau c - 2 t_0$ |
| seventh track | $\tau c - 3 t_0$ |
| eighth track | $\tau c - 4 t_0$ |

The variable delay circuits 314 are constructed of the CMOS inverters as shown in FIGS. 1 and 7 through 15.

Another embodiment of the fixed head type magnetic tape reproducing device is shown in FIG. 42. In this embodiment, the delay time is controlled by an open loop. In this embodiment, the same component parts as those in FIG. 37 are designated by the same reference numerals. In this embodiment, a synchronizing detection circuit 316 receives reproduced signals of the respective tracks of the magnetic head 312 and controls variable delay circuits 314 upon detecting the synchronizing error between the respective tracks.

According to the fixed head type magnetic tape reproducing device of the invention, adjustment such as the conventional azimuth adjustment which must be carried out for each device is unnecessary, and a complicated construction for the automatic adjustment of azimuth of the magnetic head is also unnecessary. The invention can also cope successfully with the problem of irregularity in the recording head.

I claim:

1. A signal delay device comprising:
    CMOS gate circuit means having an input terminal to which a binary input signal to be delayed is applied, an output terminal from which a delayed signal is derived and power voltage supply terminals to which operation power voltages from operation power voltage sources are applied; and
    voltage control means connected in a power supplying path for said CMOS gate circuit means in association with at least one MOS-FET of said CMOS gate circuit means for controlling voltage applied to said CMOS gate circuit means;
    control signal means for providing a user-adjustable control signal corresponding to a desired delay time, said control signal being applied to said voltage control means for the control of the applied voltage;
    the voltage applied to said CMOS gate circuit means being controlled in response to the control signal applied to said voltage control means, the amount of delay in the binary input signal between said input and output terminals of said CMOS gate circuit means thereby being controlled.

2. A signal delay device as defined in claim 1 wherein said voltage control means comprises voltage control MOS-FET means whose drain and source circuit is connected in series in a current path of said CMOS gate circuit means and the control signal is applied to a gate terminal of said voltage control MOS-FET means.

3. A signal delay device as defined in claim 1 wherein said CMOS gate circuit means comprises CMOS gates connected in cascade in plural stages, common operation power voltages being applied to the respective CMOS gates.

4. A signal delay device as defined in claim 2 wherein said voltage control MOS-FET means comprises a plurality of MOS-FET's connected in parallel between at least one power voltage supply terminal and a corresponding operation power voltage source, said control signal applied to the voltage control means comprising separate control signals being applied to gates of the respective MOS-FET's to control them separately.

5. A signal delay device comprising:
    CMOS gate circuit means having an input terminal to which a binary input signal to be delayed is applied, an output terminal from which a delayed signal is derived and power voltage supply terminals to which operation power voltages from operation power voltage sources are applied; and
    voltage control means connected in series in a power supplying path for said CMOS gate circuit means in association with at least one MOS-FET of said CMOS gate circuit means for controlling voltage applied to said CMOS gate circuit means, a control signal being applied to said voltage control means for the control of the applied voltage;
    the voltage applied to said CMOS gate circuit means being controlled in response to the control signal applied to said voltage control means and a period of delay in the binary input signal between said input and output terminals of said CMOS gate circuit means thereby being controlled;
    wherein said voltage control means comprises a plurality of MOS-FET's connected in series between said power voltage supply terminal and said operation power voltage source, said control signal applied to voltage control means comprising separate control signals being applied to gates of the respective series connected MOS-FET's of said voltage control MOS-FET means to control them separately.

6. A signal delay device comprising:
    CMOS gate circuit means having an input terminal to which a binary input signal to be delayed is applied, an output terminal from which a delayed signal is derived and power voltage supply terminals to which operation power voltages from operation power voltage sources are applied; and
    voltage control means connected in series in a power supplying path for said CMOS gate circuit means in association with at least one MOS-FET of said CMOS gate circuit means for controlling voltage applied to said CMOS gate circuit means, a control signal being applied to said voltage control means for the control of the applied voltage;
    the voltage applied to said CMOS gate circuit means being controlled in response to the control signal applied to said voltage control means and a period of delay in the binary input signal between said input and output terminals of said CMOS gate circuit means thereby being controlled;
    wherein said voltage control means comprises a MOS-FET connected between said at least one MOS-FET of said CMOS gate circuit means and said output terminal.

7. A signal delay device as defined in claim 6 wherein:
    said CMOS gate circuit means includes CMOS gates connected in series in plural stages,
    said voltage control MOS-FET means comprises a plurality of MOS-FET's provided in correspondence to said CMOS gates, said MOS-FET's being connected in series to said CMOS gates and in corresponding plural stages, and said series connected MOS-FET's controlled by a common control signal applied to gates of said MOS-FET's, and said voltage control means further comprises MOS-FET inserted between said power voltage supply terminal and said operation power voltage source and controlled by control signal which is applied to a gate thereof and is different from said common control signals.

8. A signal delay device comprising:
CMOS gate circuit means having an input terminal to which a binary input signal to be delayed is applied, an output terminal from which a delayed signal is derived and power voltage supply terminals to which operation power voltages from operation power voltage sources are applied; and
voltage control means connected in series in a power supplying path for said CMOS gate circuit means in association with at least one MOS-FET of said CMOS gate circuit means for controlling voltage applied to said CMOS gate circuit means, a control signal being applied to said voltage control means for the control of the applied voltage;
the voltage applied to said CMOS gate circuit means being controlled in response to the control signal applied to said voltage control means and a period of delay in the binary input signal between said input and output terminals of said CMOS gate circuit means thereby being controlled;
wherein said voltage control means comprises:
first and second resistor means connected respectively between sources of first and second MOS-FET's constituting said CMOS gate circuit means and the operation power voltage sources connected to the MOS-FET's;
a third MOS-FET whose drain-source path is connected between a junction of said first resistor means and the operation power voltage source therefor and the source of said second MOS-FET; and
a fourth MOS-FET whose drain source path is connected between a junction of said second resistor means and the operation voltage source therefor and the source of said first MOS-FET;
said control signal being applied to gates of said third and fourth MOS-FET's.

9. A signal delay device comprising:
CMOS gate circuit means having an input terminal to which a binary input signal to be delayed is applied, an output terminal from which a delayed signal is derived and power voltage supply terminals to which operation power voltages from operation power voltage sources are applied; and
voltage control means connected in series in a power supplying path for said CMOS gate circuit means in association with at least one MOS-FET of said CMOS gate circuit means for controlling voltage applied to said CMOS gate circuit means, a control signal being applied to said voltage control means for the control of the applied voltage;
the voltage applied to said CMOS gate circuit means being controlled in response to the control signal applied to said voltage control means and a period of delay in the binary input signal between said input and output terminals of said CMOS gate circuit means thereby being controlled;
wherein said voltage control means comprises:
a third MOS-FET connected between one of first and second MOS-FET's constituting said CMOS gate circuit means and said output terminal;
a fourth MOS-FET connected between the source of said one of the MOS-FET's and said operation power voltage source; and
said control signal being applied to gates of said third and fourth MOS-FET's.

* * * * *